United States Patent
Yamamoto et al.

(10) Patent No.: US 10,622,530 B2
(45) Date of Patent: Apr. 14, 2020

(54) ALUMINUM NITRIDE-BASED SEMICONDUCTOR DEEP ULTRAVIOLET LIGHT-EMITTING DEVICE

(71) Applicant: Sharp Kabushiki Kaisha, Sakai, Osaka (JP)

(72) Inventors: Shuhichiroh Yamamoto, Sakai (JP); Yoshihiro Ueta, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/711,685

(22) Filed: Sep. 21, 2017

(65) Prior Publication Data

US 2018/0083173 A1    Mar. 22, 2018

(30) Foreign Application Priority Data

Sep. 21, 2016    (JP) ................. 2016-184622

(51) Int. Cl.
*H01L 33/62* (2010.01)
*H01L 33/00* (2010.01)
(Continued)

(52) U.S. Cl.
CPC .......... *H01L 33/62* (2013.01); *H01L 33/0079* (2013.01); *H01L 33/32* (2013.01); *H01L 33/40* (2013.01); *H01L 33/007* (2013.01); *H01L 33/405* (2013.01); *H01L 2933/0016* (2013.01); *H01L 2933/0066* (2013.01)

(58) Field of Classification Search
CPC ............................. H01L 33/62; H01L 33/007
See application file for complete search history.

(56) References Cited

U.S. PATENT DOCUMENTS

2009/0176121 A1* 7/2009 Mizuno ................. C03C 17/007
428/606
2010/0270515 A1* 10/2010 Yasuda ................. B22F 1/0074
252/514

(Continued)

FOREIGN PATENT DOCUMENTS

CN    101875158 A    11/2010
CN    102208522 A    10/2011
(Continued)

*Primary Examiner* — Jay C Chang
*Assistant Examiner* — Mikka Liu
(74) *Attorney, Agent, or Firm* — ScienBiziP, P.C.

(57) ABSTRACT

A vertically structured, aluminum nitride-based semiconductor deep ultraviolet light-emitting device is provided that exhibits a high light emission efficiency and an improved yield. The aluminum nitride-based semiconductor deep ultraviolet light-emitting device includes: a conductive support substrate; a porous metal film having a conductive macroporous structure with a pore rate of from 10% to 50% inclusive; and an aluminum nitride-based semiconductor layer structural body with a light-emitting layer, the conductive support substrate and the aluminum nitride-based semiconductor layer structural body being bonded with the porous metal film interposed therebetween for electrical connection, wherein the aluminum nitride-based semiconductor deep ultraviolet light-emitting device has an emission peak wavelength of from 220 nm to 300 nm inclusive.

5 Claims, 15 Drawing Sheets

(51) Int. Cl.
  *H01L 33/32*  (2010.01)
  *H01L 33/40*  (2010.01)

(56) References Cited

U.S. PATENT DOCUMENTS

| | | | |
|---|---|---|---|
| 2012/0001219 A1 | 1/2012 | Park | |
| 2013/0026525 A1* | 1/2013 | Chen | H01L 33/62 |
| | | | 257/98 |
| 2014/0048816 A1 | 2/2014 | Gotoda et al. | |
| 2015/0171299 A1 | 6/2015 | Kuramoto et al. | |
| 2016/0035935 A1* | 2/2016 | Han | H01L 21/02458 |
| | | | 257/13 |
| 2019/0074403 A1* | 3/2019 | Inazu | H01L 21/205 |

FOREIGN PATENT DOCUMENTS

| | | |
|---|---|---|
| CN | 102315346 A | 1/2012 |
| JP | 2009-231560 A | 10/2009 |
| JP | 5146817 B2 | 2/2013 |
| JP | 2014-038920 A | 2/2014 |
| JP | 5792694 B2 | 10/2015 |
| JP | 2016-018951 A | 2/2016 |

\* cited by examiner

ALUMINUM NITRIDE-BASED SEMICONDUCTOR DEEP ULTRAVIOLET LIGHT-EMITTING DEVICE

FIELD OF THE INVENTION

The present invention relates to aluminum nitride-based semiconductor deep ultraviolet light-emitting devices.

CROSS-REFERENCE TO RELATED APPLICATIONS

The present application hereby claims priority under 35 U.S.C. § 119 to Japanese Patent Application, Tokugan, No. 2016-184622 filed Sep. 21, 2016, the entire contents of which are hereby incorporated herein by reference.

BACKGROUND OF THE INVENTION

Aluminum nitride-based semiconductor devices including an AlGaN light-emitting layer are compound semiconductor devices that become capable of emitting light primarily in the near ultraviolet region through adjustment of the aluminum composition of the light-emitting layer. Ultraviolet light is an electromagnetic wave with wavelengths ranging from 10 nm to 400 nm. In particular, the ultraviolet light with wavelengths from 200 nm to 400 nm is called near ultraviolet light (NUV). In some cases, near ultraviolet light is further divided into UVA (between and including 315 nm and 400 nm), UVB (longer than or equal to 280 nm and shorter than 315 nm), and UVC (shorter than 280 nm). In addition, the ultraviolet light with wavelengths of 300 nm or shorter is sometimes called deep ultraviolet light (DUV). By using an aluminum nitride-based semiconductor with an AlGaN light-emitting layer and suitably increasing or decreasing the Al composition of the layer, a semiconductor light-emitting device can be manufactured that is theoretically capable of emitting near ultraviolet light with wavelengths from 192 nm to 365 nm. Examples of conventional semiconductor light-emitting devices based on a semiconductor material include light-emitting diodes (LEDs), semiconductor laser diodes (semiconductor LDs), and superluminescent diodes (SLDs).

Semiconductor light-emitting devices manufactured using aluminum nitride-based semiconductors are expected to replace, for example, conventional ultraviolet light lamps and sources and to find applications in the fields of, for example, disinfection, resin curing, and medical procedures, by relying on their light emission capability in the ultraviolet region (especially, in the deep ultraviolet region of 300 nm or shorter wavelengths). Today, research and development is actively pursued, and small-scale manufacturing of deep ultraviolet LEDs has already been started.

Deep ultraviolet LEDs developed so far (wavelengths of 300 nm or shorter), however, have a light emission efficiency of approximately a few percent, which is far lower than the efficiency of the commercialized blue LED (which is a few dozen percent). This is attributable to factors such as the physical constants of the aluminum nitride-based semiconductor itself used in the deep ultraviolet LED, factors such as crystal growth and other device manufacturing technology, and combinations of these factors.

Examples of the physical constant-related factors include (i) very low light extraction efficiency in guiding the ultraviolet light generated in the light-emitting layer out of the semiconductor due to the low refractive index of the aluminum nitride-based semiconductor and (ii) high likelihood of absorption by substances inside and outside the device due to short, ultraviolet region emission wavelengths. Examples of the device manufacturing technology-related factors include the need for advanced technology to produce high quality crystal with high yields and high reproducibility because the aluminum nitride-based semiconductor is manufactured at as high as 1,000° C. or at even higher temperatures. Examples of the combined factors include the fact that AlGaN, if containing more than 25% Al, is difficult to render p-type even with high-concentration p-type doping because of high acceptor activation energy and also the fact that high p-type carrier density is difficult to achieve due to, for example, difficulty in growing AlGaN crystals and resultant incomplete crystallinity of AlGaN and under the influence of, for example, residual donors produced by contamination with unintended oxygen and other impurities.

An aluminum nitride-based semiconductor light-emitting device is manufactured typically by stacking many semiconductor layers on an underlayer substrate such as a sapphire substrate using MOCVD apparatus or like crystal growing apparatus. A bulk AlN substrate may be used as the underlayer substrate.

When a sapphire substrate is used as an underlayer substrate on which crystal is to be grown for an aluminum nitride-based semiconductor layer, it is difficult to form a high quality semiconductor layer because numerous crystal defects and cracks occur in the aluminum nitride-based semiconductor layer due to a difference in lattice constant between the sapphire substrate and the aluminum nitride-based semiconductor layer. A method addressing this problem is publicly known where an AlN buffer layer is formed on a sapphire substrate before sequentially stacking an n-type AlGaN contact layer, a light-emitting layer, a p-type contact layer, and other layers to obtain a high quality growth layer. Another method is also publicly known where AlN, which exhibits a lattice constant that is close to that of the AlGaN layer serving as a light-emitting layer, is used as a substrate for high quality crystallinity to obtain a high quality growth layer. Various research and development activities are also being undertaken in research institutions to find a method to increase light extraction efficiency.

When a sapphire substrate is used as an underlayer substrate on which crystal is to be grown for an aluminum nitride-based semiconductor layer, the lack of electric conductivity of the sapphire substrate necessitates a parallel and lateral electrode structure where materials need to be removed by dry etching down to the n-type layer to form an n-type electrode. However, in the parallel electrode structure, light emission efficiency drops significantly due to current concentration. Blue LEDs and other light-emitting devices that use an InGaN-based semiconductor have the same problem of low light emission efficiency caused by current concentration. Aluminum nitride-based semiconductors, both p- and n-types, have a far higher resistivity than InGaN-based semiconductors and are hence more susceptible to current concentration-caused low light emission efficiency than blue LEDs.

To solve these problems that result from the lateral structure, methods are being investigated of detaching the underlayer substrate (e.g., sapphire substrate) after an aluminum nitride-based semiconductor layer structural body is attached to a conductive support substrate.

For the blue LED, technology is established where a semiconductor light-emitting device is manufactured by bonding a support substrate to a semiconductor layer grown on an underlayer substrate and thereafter removing the underlayer substrate (sapphire substrate) and other related elements, as described in Japanese Unexamined Patent Application Publication, Tokukai, No. 2009-231560 (Patent Literature 1) and Japanese Unexamined Patent Application Publication, Tokukai, No. 2014-38920 (Patent Literature 2).

CITATION LIST

Patent Documents

Patent Document 1: Japanese Unexamined Patent Application Publication, Tokukai, No. 2009-231560
Patent Document 2: Japanese Unexamined Patent Application Publication, Tokukai, No. 2014-38920

SUMMARY OF THE INVENTION

Problems to Be Solved by the Invention

The inventors of the present invention, in order to fabricate an aluminum nitride-based semiconductor deep ultraviolet light-emitting device with a vertical structure, have been developing a vertical structure that can be manufactured primarily by steps of bonding an aluminum nitride-based semiconductor layer structural body and a conductive support substrate and detaching a sapphire substrate, by means of, for example, a process by which various bonding layers are formed on a conductive support substrate.

This approach, however, can only achieve undesirably low yields due to, for example, the aluminum nitride-based semiconductor layer structural body detaching from the support substrate and numerous cracks in the aluminum nitride-based semiconductor layer structural body causing defective electrical characteristics. These decreases in the yield are caused by the following reasons.

In both p-types and n-types of aluminum nitride-based semiconductors, it is difficult to form an electrode with good ohmic properties because of incomplete crystallinity and their low carrier density. To obtain a good ohmic electrode, an electrode alloying process needs to be performed at a temperature higher than the bonding temperature (i.e., 500° C.), and the bonding layer that bonds a support substrate and an aluminum nitride-based semiconductor layer structural body hence needs to have high temperature resistance.

In addition, in the high-temperature heat treatment that is performed at 500° C. or higher temperatures for the purpose of imparting ohmic properties, stress is produced in the interior of, and at the bonding interfaces between, the support substrate, the bonding layer, the aluminum nitride-based semiconductor layer structural body, and the underlayer substrate due to differences in thermal expansion coefficient between the support substrate, the bonding layer, the aluminum nitride-based semiconductor layer structural body, and the underlayer substrate. That stress in turn causes, for example, the aluminum nitride-based semiconductor layer structural body to detach from the support substrate and cracks to form in the aluminum nitride-based semiconductor layer structural body and in the bonding layer, which leads to decreases in yield. Particularly, if a support substrate is used that has a very different thermal expansion coefficient from that of the underlayer substrate, the aluminum nitride-based semiconductor layer structural body frequently detaches from the support substrate; if a bonding layer is used that have a higher thermal expansion coefficient than the support substrate, cracks form in the aluminum nitride-based semiconductor layer structural body and/or in the bonding layer.

If the n-type electrode alloying process is not performed at a temperature of 500° C. or higher to prevent the aluminum nitride-based semiconductor layer structural body from detaching from the support substrate and cracks from forming in the aluminum nitride-based semiconductor layer structural body and in the bonding layer, an n-type electrode with good ohmic properties cannot be obtained, which could degrade the voltage characteristics, the light output properties, and the light emission efficiency of the aluminum nitride-based semiconductor deep ultraviolet light-emitting device.

As detailed here, it has been difficult to fabricate a vertically structured, aluminum nitride-based semiconductor deep ultraviolet light-emitting device with good characteristics at high yield.

In the manufacture of conventional blue LEDs and other like light-emitting devices, the aluminum nitride-based semiconductor layer structural body and the support substrate are bonded typically using a high bulk density, continuous film of, for example, AuSn or another like alloy that forms a eutectic crystal at a temperature of approximately 300° C. or lower for the following reasons. In the blue LED, an n-type ohmic electrode can be so easily formed on an n-type GaN after the growth substrate is detached that no heat treatment is needed to be performed at or above the bonding temperature of the aluminum nitride-based semiconductor layer structural body after the formation of the n-type electrode.

In a deep ultraviolet light-emitting device using an aluminum nitride-based semiconductor, however, it is necessary to perform a heat treatment at or above the bonding temperature of the aluminum nitride-based semiconductor layer structural body after the formation of the n-type electrode. AuSn and other like alloys that form a eutectic crystal at a temperature of approximately 300° C. or lower will melt in a high-temperature heat treatment at a temperature of 500° C. or higher performed for the purpose of forming an n-type ohmic electrode. The melting induces the aluminum nitride-based semiconductor layer structural body to detach from the support substrate. It is therefore difficult to apply conventional technology without any modifications.

The aluminum nitride-based semiconductor layer structural body could be prevented from detaching from in the heat treatment step for forming this n-type ohmic electrode if it is, for example, fixed to the support substrate. But, stress would still be produced in the interior of, and at the bonding interfaces between, the support substrate, the bonding layer, and the aluminum nitride-based semiconductor layer structural body due to differences in thermal expansion coefficient between the support substrate, the bonding layer, and the aluminum nitride-based semiconductor layer structural body. After the heat treatment, the stress produced due to the different thermal expansion coefficients could cause numerous cracks to form in the aluminum nitride-based semiconductor layer structural body and in the bonding layer or the aluminum nitride-based semiconductor layer structural body to detach from the support substrate, leading to significant decreases in yield.

Accordingly, the present invention has an object to provide an aluminum nitride-based semiconductor deep ultraviolet light-emitting device, capable of solving these problems, that exhibits a high light emission efficiency and a high yield.

Solution to the Problems

An aspect of the present invention is directed to an aluminum nitride-based semiconductor deep ultraviolet light-emitting device including: a conductive support substrate; a porous metal film having a conductive macroporous structure with a pore rate of from 10% to 50% inclusive; and an aluminum nitride-based semiconductor layer structural body with a light-emitting layer, the conductive support substrate and the aluminum nitride-based semiconductor layer structural body being bonded with the porous metal film interposed therebetween for electrical connection, wherein the aluminum nitride-based semiconductor deep ultraviolet light-emitting device has an emission peak wavelength of from 220 nm to 300 nm inclusive. In this aspect, the aluminum nitride-based semiconductor deep ultraviolet light-emitting device is capable of restraining the aluminum nitride-based semiconductor layer structural body from detaching from the heat-treated support substrate and cracks from forming in the aluminum nitride-based semiconductor layer structural body and in the porous metal film, due to differences in thermal expansion coefficient between the support substrate, the aluminum nitride-based semiconductor layer structural body, and the porous metal film which is a bonding layer for the support substrate and the aluminum nitride-based semiconductor layer structural body. The aspect of the present invention is hence capable of providing a vertically structured, aluminum nitride-based semiconductor deep ultraviolet light-emitting device that exhibits a high light emission efficiency and a high yield.

In the aluminum nitride-based ultraviolet light-emitting device in the above aspect, the aluminum nitride-based semiconductor layer structural body may include a first-conductive-type contact layer, the light-emitting layer, and a second-conductive-type contact layer in this sequence; the second-conductive-type contact layer may be bonded to the conductive support substrate with the porous metal film interposed therebetween for electrical connection; and the aluminum nitride-based ultraviolet light-emitting device may further include a first-conductive-side electrode bonded at least to a part of the first-conductive-type contact layer for electrical connection. This aluminum nitride-based ultraviolet light-emitting device is capable of restraining the aluminum nitride-based semiconductor layer structural body from detaching from the heat-treated support substrate and cracks from forming in the aluminum nitride-based semiconductor layer structural body and in the porous metal film, due to differences in thermal expansion coefficient between the support substrate, the aluminum nitride-based semiconductor layer structural body, and the porous metal film which is a bonding layer for the support substrate and the aluminum nitride-based semiconductor layer structural body. This particular aspect of the invention is hence capable of providing a vertically structured, aluminum nitride-based semiconductor deep ultraviolet light-emitting device that exhibits a high light emission efficiency and a high yield.

Advantageous Effects of the Invention

The foregoing and other objectives, features, and advantages of the invention will be more readily understood upon consideration of the following detailed description of the invention, taken in conjunction with the accompanying drawings.

DESCRIPTION OF EMBODIMENTS

Figure 1:
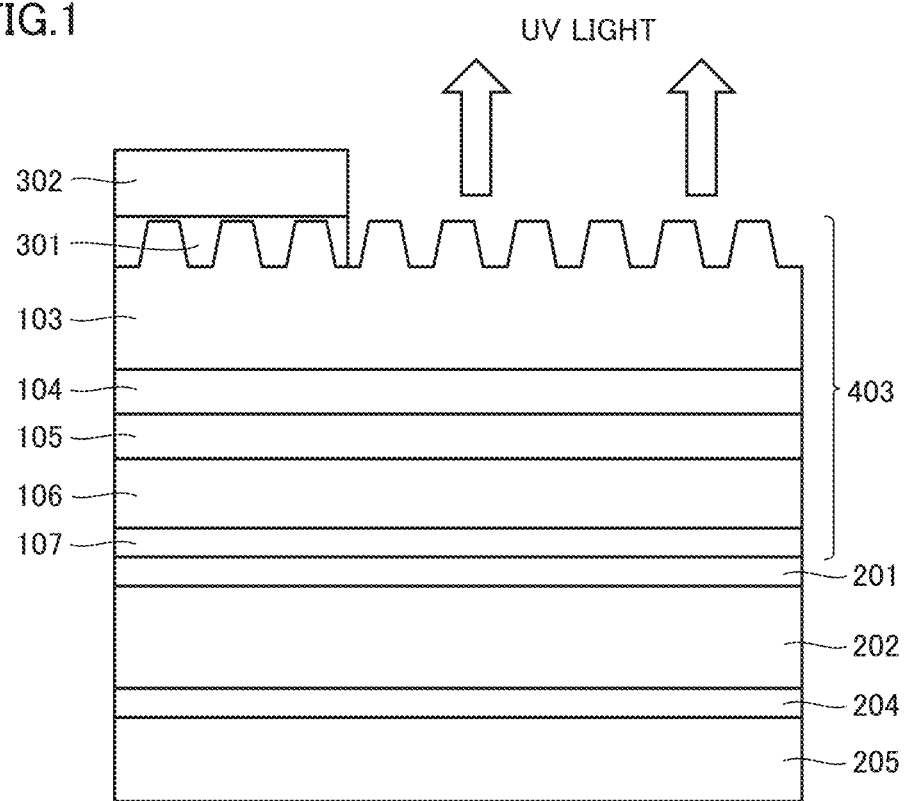
FIG. 1 is a schematic cross-sectional view representing an exemplary aluminum nitride-based semiconductor deep ultraviolet light-emitting device in accordance with Embodiment 1 of the present invention.

The following will describe embodiments of the present invention in detail in reference to drawings. Throughout the drawings attached to this specification, the same reference numerals and signs are used to indicate the same or equivalent elements.

Embodiment 1

Figure 2:
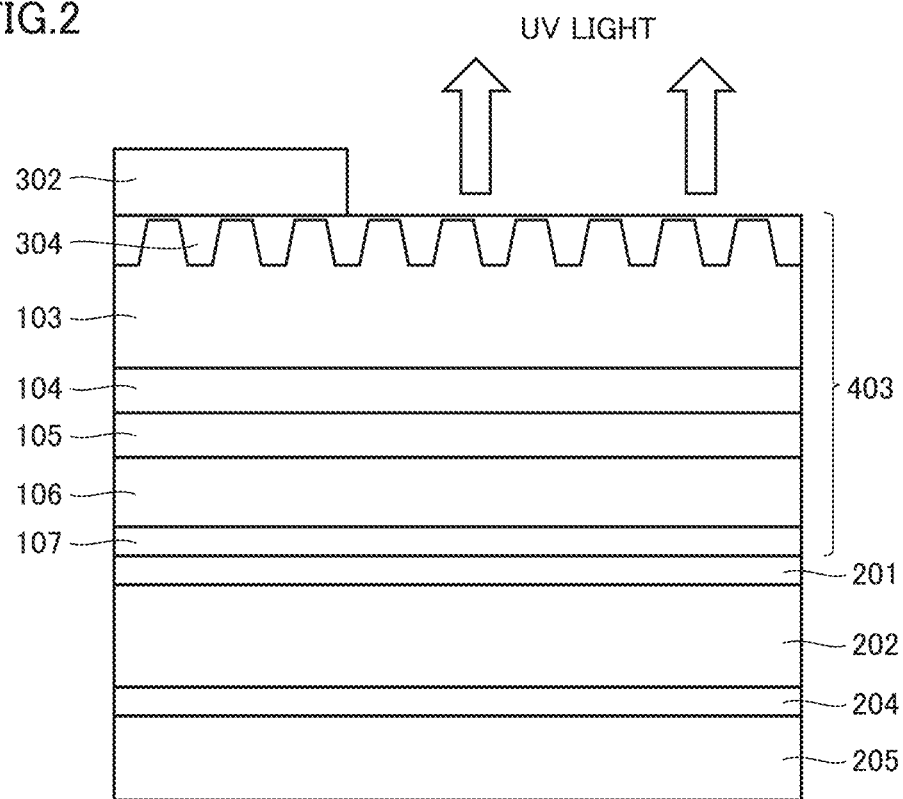
FIG. 2 is a schematic cross-sectional view representing another exemplary aluminum nitride-based semiconductor deep ultraviolet light-emitting device in accordance with Embodiment 1 of the present invention.

Structure of Aluminum Nitride-based Semiconductor Deep Ultraviolet Light-emitting Device Referring to FIGS. 1 and 2, an aluminum nitride-based semiconductor deep ultraviolet light-emitting device of the present embodiment (this term refers throughout the following description a light-emitting device that includes an aluminum nitride-based semiconductor layer structural body 403 including a light-emitting layer 104) is vertically structured and stripped of the entire underlayer substrate used to form the aluminum nitride-based semiconductor layer structural body 403. Specifically, the aluminum nitride-based semiconductor deep ultraviolet light-emitting device of the present embodiment includes a conductive support substrate 205, a porous metal film 204 having a conductive macroporous structure with a pore rate of from 10% to 50% inclusive, and the aluminum nitride-based semiconductor layer structural body 403 including the light-emitting layer 104. The conductive support substrate 205 and the aluminum nitride-based semiconductor layer structural body 403 are bonded with the porous metal film 204 interposed therebetween for electrical connection. The aluminum nitride-based semiconductor deep ultraviolet light-emitting device has an emission peak wavelength of from 220 nm to 300 nm inclusive. In this context, the aluminum nitride-based semiconductor layer structural body 403 includes first-conductive-type contact layer 103, the light-emitting layer 104, and second-conductive-type contact layer 107 in this sequence. The second-conductive-type contact layer 107 is bonded to the conductive support substrate 205 with the porous metal film 204 interposed therebetween for electrical connection. The aluminum nitride-based semiconductor deep ultraviolet light-emitting device further includes first-conductive-side electrodes (either a first-conductive-side contact electrode 301 and a first-conductive-side pad electrode 302 in FIG. 1 or a first-conductive-side translucent conductive film 304 and the first-conductive-side pad electrode 302 in FIG. 2) bonded at least to a part of the first-conductive-type contact layer 103 (either a part of the surface, of the first-conductive-type contact layer 103, that forms a main face of the first-conductive-type contact layer 103 in FIG. 1 or the entire surface, of the first-conductive-type contact layer 103, that forms a main face of the first-conductive-type contact layer 103 in FIG. 2) for electrical connection.

The aluminum nitride-based ultraviolet light-emitting device of the present embodiment is capable of restraining the aluminum nitride-based semiconductor layer structural body 403 from detaching from the heat-treated, conductive support substrate 205 and cracks from forming in the aluminum nitride-based semiconductor layer structural body 403 and in the porous metal film 204, due to differences in thermal expansion coefficient between the conductive support substrate 205, the aluminum nitride-based semiconductor layer structural body 403, and the porous metal film 204 which is a bonding layer for the conductive support substrate 205 and the aluminum nitride-based semiconductor layer structural body 403. The present embodiment is hence capable of providing a vertically structured, aluminum nitride-based semiconductor deep ultraviolet light-emitting device that exhibits a high light emission efficiency and a high yield.

The aluminum nitride-based light-emitting device of the present embodiment is specifically a vertically structured light-emitting device in which the aluminum nitride-based semiconductor layer structural body 403 is provided on the conductive support substrate 205 with the porous metal film 204 interposed therebetween. The aluminum nitride-based semiconductor layer structural body 403 is a stack of the second-conductive-type contact layer 107, a second-conductive-type layer 106, a second-conductive-type block layer 105, the light-emitting layer 104, and the first-conductive-type contact layer 103 provided in this sequence. The porous metal film 204 has a conductive macroporous structure with a pore rate of from 10% to 50% inclusive. Either the first-conductive-side contact electrode 301 (FIG. 1) or the first-conductive-side translucent conductive film 304 (FIG. 2) is bonded at least to a part of the first-conductive-type contact layer 103 for electrical connection.

Conductive Support Substrate

The conductive support substrate 205 is a conductive substrate that supports the aluminum nitride-based semiconductor layer structural body 403. The conductive support substrate 205 is preferably a silicon substrate in view of a high conductivity thereof and a low on-state resistance of the vertically structured, aluminum nitride-based light-emitting device. A silicon substrate is desirable also because silicon allows for the easiest processing among commercialized semiconductor materials, there are sophisticated silicon processing technology available, and silicon material and its processing cost are inexpensive.

Aluminum Nitride-Based Semiconductor Layer Structural Body

The aluminum nitride-based semiconductor layer structural body 403 is a structural body including at least one aluminum nitride- (AlN-)containing semiconductor layer (e.g., $Al_xGa_{1-x}N$ semiconductor layer (0<x1)), includes at least the first-conductive-type contact layer 103, the light-emitting layer 104, and the second-conductive-type contact layer 107 in this sequence, and functions as a light-emitting device. In this context, the first-conductive-type contact layer 103 is preferably a first-conductive-type $Al_xGa_{1-x}N$ contact layer (0<x≤1, and x≤Average Al Composition of Light-emitting Layer 104) to transmit the light emitted by the light-emitting layer 104 and avoid low light emission efficiency The light-emitting layer 10.4 preferably has a multiple quantum well structure including a plurality of cycles of $Al_sGa_{1-s}N$ barrier layers (0<s≤1) and $Al_tGa_{1-t}N$ well layers (0≤t<1) in view of improved stability of emission wavelength against temperature and increased internal quantum efficiency. The second-conductive-type contact layer 107 is preferably a second-conductive-type $Al_yGA_{1-y}N$ contact layer (0.25≤y≤1) because such a layer transmits most of the light emitted by the light-emitting layer 104, does not decrease light emission efficiency, and lowers contact resistance.

Porous Metal Film

The porous metal film 204 is a metal film having a conductive macroporous structure with a pore rate of from 10% to 50% inclusive. In this context, the pore rate is calculated as follows. The percentage of the pores' cross-sectional area to the whole cross-sectional area (pore area ratio) is obtained from observation of an arbitrarily specified cross-section of the porous metal film 204 by SEM (scanning electron microscopy). This pore area ratio is raised to the power of 3/2 to obtain a pore rate. Because the pore area ratio of the cross-section could vary depending on where it is measured, the pore rate is preferably calculated, for example, by measuring the pore area ratios of two or more cross-sections and taking the average of them. The pore rate is at least 10%, preferably at least 15%, and more preferably at least 20% to reduce stress in the porous metal film in bonding the aluminum nitride-based semiconductor layer structural body. In addition, the pore rate is 50% or less, preferably 45% or less, and more preferably 40% or less to secure a bonding area and sufficient bonding strength in bonding the aluminum nitride-based semiconductor layer structural body.

In this context, the macroporous structure refers to a structure in which the pores have a pore diameter distribution of greater than 50 nm. The macroporous structure of the porous metal film 204 reduces stress produced in the interior of, and at the bonding interfaces between, the conductive support substrate 205, the aluminum nitride-based semiconductor layer structural body 403, and the porous metal film 204 due to differences in thermal expansion coefficient between the conductive support substrate 205, the aluminum nitride-based semiconductor layer structural body 403, and the porous metal film 204, thereby restraining the aluminum nitride-based semiconductor layer structural body 403 from detaching from the heat-treated, conductive support substrate 205 and cracks from forming in the aluminum nitride-based semiconductor layer structural body 403 and in the porous metal film 204.

The porous metal film 204 preferably contains silver in view of a high conductivity thereof and a low on-state resistance of the vertically structured, aluminum nitride-based light-emitting device. A silver-containing porous metal film is desirable also in view of silver's high reflectance for deep ultraviolet light.

Emission Peak Wavelength

The aluminum nitride-based light-emitting device of the present embodiment has an emission peak wavelength in the deep ultraviolet region of from 220 nm to 300 nm inclusive. The half width of the emission peak is approximately a few dozen nanometers or narrower.

Method of Manufacturing Aluminum Nitride-based Semiconductor Deep Ultraviolet Light-emitting Device The method of manufacturing the aluminum nitride-based light-emitting device of the present embodiment is not limited in any particular manner, and in view of efficient manufacturing, preferably includes: a step of forming an aluminum nitride-based semiconductor layer structural body on an underlayer substrate; a step of activating second-conductive-type layers (namely, the second-conductive-type block layer 105, the second-conductive-type layer 106, and the second-conductive-type contact layer 107); a step of forming a second-conductive-side electrode and a reflective electrode; a step of bonding a conductive support substrate using a porous metal film; a step of removing the underlayer substrate; a step of forming a light extraction structure; and a step of forming first-conductive-side electrodes first-conductive-side contact electrode and a first-conductive-side pad electrode).

Figure 3:
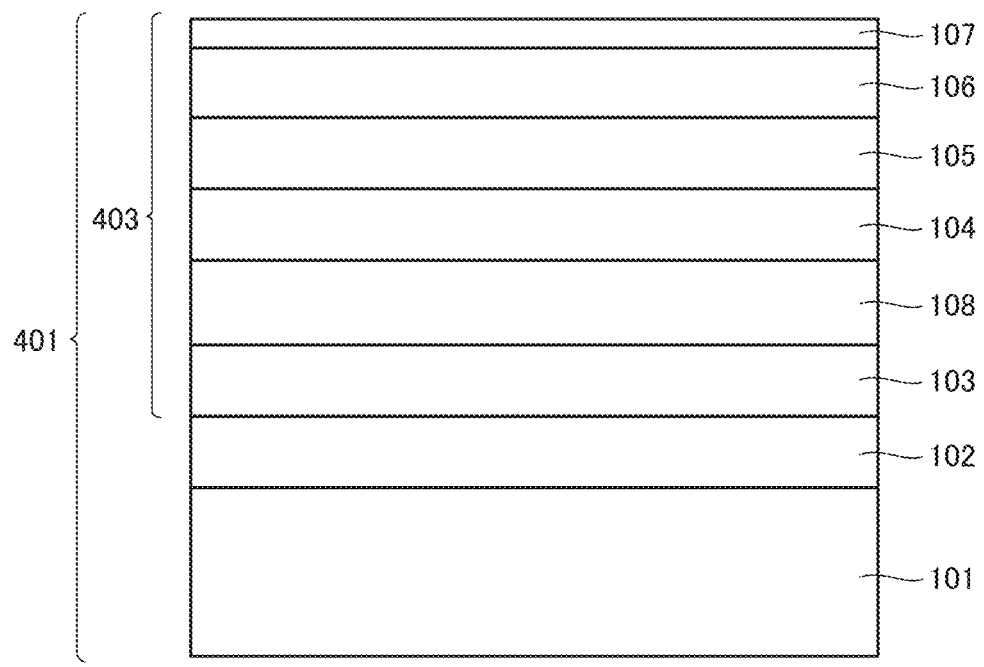
FIG. 3 is a schematic cross-sectional view representing an exemplary aluminum nitride-based semiconductor deep ultraviolet light-emitting device in accordance with Embodiments 1 to 4 of the present invention during the manufacture thereof after an aluminum nitride-based semiconductor wafer is formed.

Step of Forming Aluminum Nitride-based Semiconductor Layer Structural Body on Underlayer Substrate Referring to FIG. 3, an underlayer substrate 101 on which the aluminum nitride-based semiconductor layer structural body 403 is to be formed is suitably a sapphire substrate in order to form the aluminum nitride-based semiconductor layer structural body 403 with high quality. Apart from a sapphire substrate, the underlayer substrate 101 may be, for example, a silicon substrate, a silicon nitride substrate, or a gallium nitride substrate. An aluminum nitride-based semiconductor layer from which the aluminum nitride-based semiconductor layer structural body 403 is to be formed on the underlayer substrate 101 is suitably grown by MOCVD (metal-organic chemical vapor deposition), MBE (molecular beam epitaxy), or another like method to efficiently grow the aluminum nitride-based semiconductor layer structural body 403 with high quality and precise thickness.

Specifically, as shown in FIG. 3, an AlN buffer layer with a thickness of 5 to 500 nm (e.g., 300 nm) as a buffer layer 102, an n-type $Al_{0.65}Ga_{0.35}N$ contact layer with a thickness of 1 to 5 μm (e.g., 3 μm) as the first-conductive-type contact layer 103, an n-type $Al_{0.60}Ga_{0.40}N$ layer as a first-conductive-type layer 108, the light-emitting layer 104 having a multiple quantum well structure of 6 cycles of $Al_{0.80}Ga_{0.20}N$ barrier layers and $Al_{0.55}Ga_{0.45}N$ well layers, a p-type $Al_{0.85}Ga_{0.15}N$ block layer with a thickness of 5 to 300 nm (e.g., 15 nm) as the second-conductive-type block layer 105, a p-type $Al_{0.60}Ga_{0.40}N$ layer with a thickness of 50 to 1,000 nm (e.g., 150 nm) as the second-conductive-type layer 106, and a p-type $Al_{0.25}Ga_{0.75}N$ contact layer with a thickness of 20 to 500 nm (e.g., 50 nm) as the second-conductive-type contact layer 107 are epitaxially grown in this sequence on a main face of the sapphire substrate as the underlayer substrate 101 in MOCVD apparatus for a stack of these layers, to obtain an aluminum nitride-based semiconductor wafer 401 in which the aluminum nitride-based semiconductor layer structural body 403 is formed on a main face of the underlayer substrate 101.

In this context, the first-conductive-type layer 108 and the second-conductive-type layer 106 are respectively referred to as an n-type cladding layer and/or an n-type guide layer and a p-type cladding layer and/or a p-type guide layer, depending on the type of light-emitting device. The Al and Ga compositions and thicknesses of these layers may all be adjusted in a suitable manner. When both a cladding layer and a guide layer are needed, the first-conductive-type layer 108 and the second-conductive-type layer 106 may have a multilayer structure of two or more n- and p-type aluminum nitride-based semiconductor layers with different Al compositions.

Either one of the first-conductive-type layer 108 and the second-conductive-type layer 106 may be missing from an aluminum nitride-based deep ultraviolet LED. FIGS. 1 and 2 illustrate an aluminum nitride-based semiconductor deep ultraviolet light-emitting device in which the first-conductive-type layer 108 is omitted.

The light-emitting layer of the present embodiment includes a stack of: 6 cycles of alternate $Al_{0.80}Ga_{0.20}N$ barrier layers (each 120 nm thick) with an 80% Al composition and $Al_{0.55}Ga_{0.45}N$ well layers (each 60 nm thick) with a 55% Al composition; and an $Al_{0.75}Ga_{0.25}N$ layer (thickness: 40 nm) as a last barrier layer. Alternatively, the barrier layers may be, for example, AlN layers. In addition, if each layer is less than 100 nm thick, a plurality of non-doped or n-type $Al_xGa_{1-x}N$ layers (0<x≤1) with any Al composition, including AlN layers, may be provided immediately preceding or following the cyclic barrier/well layer structure. These layers also form a part of the light-emitting layer. By suitably adjusting the Al compositions of the well layers between and including 25 to 75%, the emission peak wavelength can be adjusted to approximately 300 to 220 nm.

Step of Activating Second-conductive-type Layers

Next, the aluminum nitride-based semiconductor wafer 401 is taken out of the MOCVD apparatus and subjected to a heat treatment to activate p-type layers (a p-type $Al_{0.85}Ga_{0.15}N$ block layer, a p-type $Al_{0.60}Ga_{0.40}N$ layer, and a p-type $Al_{0.25}Ga_{0.75}N$ contact layer) serving as the second-conductive-type layers (the second-conductive-type block layer 105, the second-conductive-type layer 106, and the second-conductive-type contact layer 107). Specifically, the aluminum nitride-based semiconductor wafer 401 is put into heat treatment apparatus for heat treatment at a temperature as high as 650 to 1350° C. (e.g., 900° C.) for 1 to 30 minutes (e.g., 5 minutes). The heat treatment may be performed, for example, in a nitrogen atmosphere, a nitrogen/oxygen-mixed atmosphere containing nitrogen and 0.1 to 100% (e. 3%) oxygen, or a pure oxygen atmosphere. In the present embodiment, the heat treatment is performed in a pure oxygen atmosphere. This heat treatment facilitates activation of the p-type layers and decreases the resistance of the p-type layers. This decreasing of resistance occurs because the hydrogen atoms bound to the magnesium atoms added as impurities to the p-type layers are released in the heat treatment to allow the magnesium atoms to be activated to become acceptors.

Step of Forming Second-conductive-side Electrode and Reflective Electrode

Figure 4:
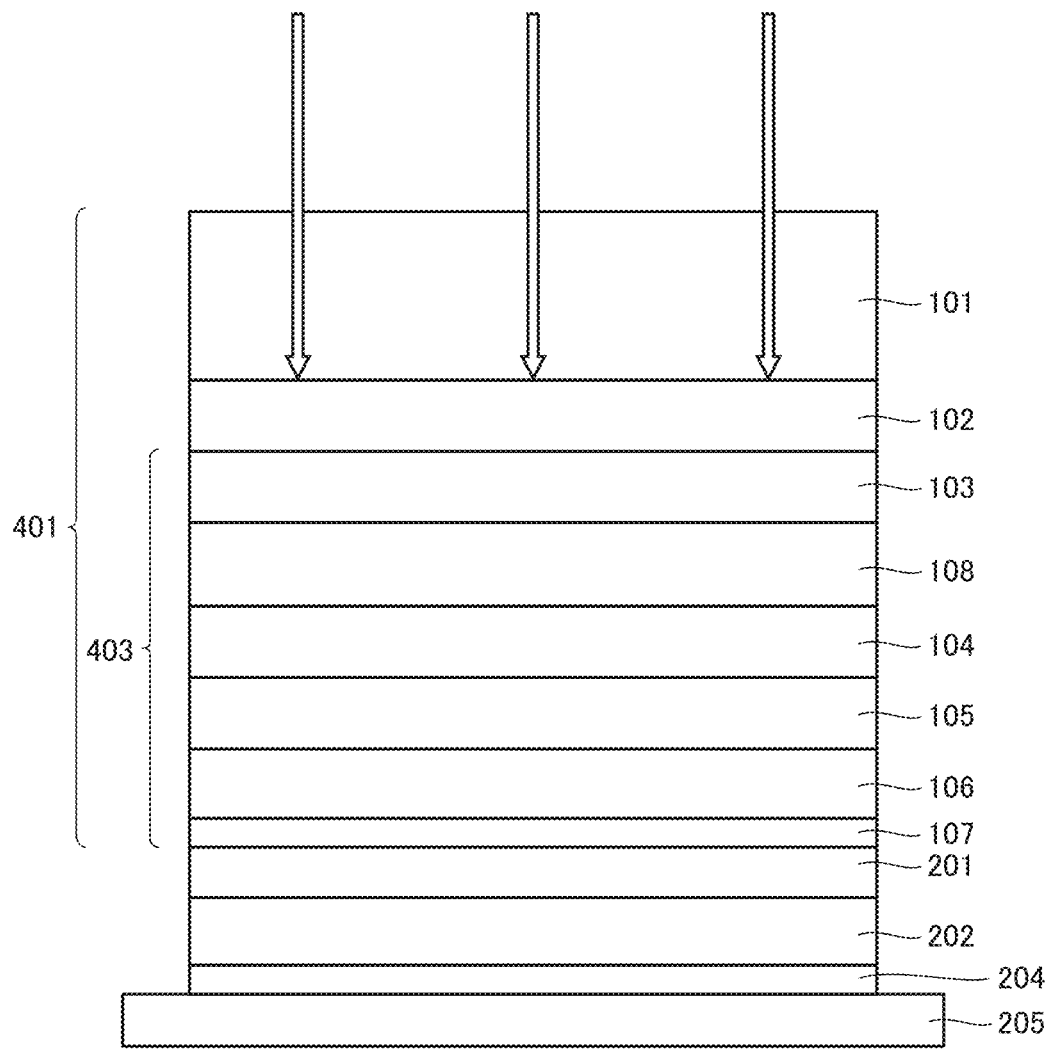
FIG. 4 is a schematic cross-sectional view representing the exemplary aluminum nitride-based semiconductor deep ultraviolet light-emitting device in accordance with Embodiments 1 to 4 of the present invention during the manufacture thereof when an underlayer substrate is to be removed.

Next, as shown in FIG. 4, a second-conductive-side contact electrode 201 (p-type contact electrode) and the reflective electrode 202 are formed on the second-conductive-type contact layer 107 of the aluminum nitride-based semiconductor wafer 401 in which the p-type (second-conductive-type) layers have been activated in the heat treatment. More specifically, the aluminum nitride-based semiconductor wafer 401 in which the p-type (second-conductive-type) layers have been activated in the heat treatment is put into vacuum vapor deposition apparatus where the second-conductive-side contact electrode 201, including Ni and Au thin films, is formed on the second-conductive-type contact layer 107 of the aluminum nitride-based semiconductor wafer 401. The second-conductive-side contact electrode 201 has a transmittance of preferably greater than or equal to 75% and more preferably greater than or equal to 95% in order to suppress absorption of light by the second-conductive-side contact electrode 201. For this purpose, the second-conductive-side contact electrode 201 preferably has a thickness of 0.5 to 50 nm. The thickness of each one of the Ni and Au layers may be altered in any manner in the range of 0 nm to 50 nm provided that the total thickness of the two layers is in the range of 0.5 to 50 nm given above. Additionally, if the total thickness of the layers is in the range of 0.5 to 50 nm, a Ni layer and a Au layer may be provided alternately to form a stack of three or more layers of them, and alternatively a single Ni or Au may be provided alone. The inventors have verified that the second-conductive-side contact electrode 201 comes to exhibit a transmittance of 96% (measured at a wavelength of 280 nm) after a subsequent electrode alloying process if the first, Ni layer is 2.5 nm thick, and the second, Au layer is 2.5 nm thick for a total thickness of 5.0 nm. After forming the second-conductive-side contact electrode 201 composed of Ni and Au, an electrode alloying process is performed to render the second-conductive-side contact electrode 201 an alloy and ohmic electrode. The electrode alloying process is performed in a 100% oxygen atmosphere, under 1 atm, and at 500° C. for 5 minutes after the aluminum nitride-based semiconductor wafer 401 in which the second-conductive-side contact electrode 201 has been formed is put into a heat treatment oven. Next, the reflective electrode 202 composed of Al is preferably formed on the second-conductive-side contact electrode 201. The reflective electrode 202 is formed by Al vapor deposition in vacuum vapor deposition apparatus. The reflective electrode 202 is preferably formed uniformly across the whole surface of the aluminum nitride-based semiconductor wafer 401 to fulfill the need to reflect the light emitted by the light-emitting layer 104 with a marginal loss.

Step of Bonding Conductive Support Substrate Using Porous Metal Film

Next, as shown in FIG. 4, the aluminum nitride-based semiconductor wafer 401 on which the second-conductive-side contact electrode 201 and the reflective electrode 202 have been formed is bonded to the conductive support substrate 205 using the porous metal film 204. In the aluminum nitride-based light-emitting device, this bonding enables the ultraviolet light with wavelengths from 220 nm to 300 nm inclusive emitted by the light-emitting layer 104 toward the conductive support substrate 205 to pass through the second-conductive-side contact electrode 201, reflect off the reflective electrode 202 and the porous metal film 204 having a macroporous structure, pass through the second-conductive-side contact electrode 201 again, and propagate away from the conductive support substrate 205.

The bonding of the conductive support substrate using the porous metal film is performed by sintering a conductive paste blended with metal particles at high temperature and under high pressure to form the porous metal film 204 having a macroporous structure. Specifically, to establish an electrical contact between the porous metal film 204 and the conductive support substrate 205, a silver- (Ag-)containing conductive paste is applied using a screen printer onto a silicon substrate (the conductive support substrate 205) on which a first, Ni layer (thickness: 20 nm) and a second, Au layer (thickness: 250 nm) are formed. The aluminum nitride-based semiconductor wafer 401 is then mounted to the conductive paste in such a manner that the face of the wafer 401 where the second-conductive-side contact electrode 201 resides can come into contact with the conductive paste. The mounted wafer is put into thermocompression apparatus for compression under 50 atm and at 350° C. for 60 minutes, to bond the conductive support substrate 205 (silicon substrate) and the aluminum nitride-based semiconductor wafer 401 with the porous metal film 204 having a macroporous structure interposed therebetween. The silver-containing conductive paste is adjusted in terms of silver content, density, clay, composition, and other factors in view of the wafer bonding conditions of the present embodiment, so that the conductive paste can come to have a macroporous structure after sintering. The paste exhibits a high wafer bonding strength and a high conductivity after the bonding is performed under the wafer bonding conditions.

Some exemplary sets of wafer bonding conditions in the pressure range of from 1 atm to 100 atm and the temperature range of from 200° C. to 350° C. are as follows: the porous metal film has a 50% or higher pore rate under a pressure of 1 atm (no pressurization) with no condition on temperature; the porous metal film 204 has a 50% pore rate under a pressure of 5 atm and at a temperature of 225° C.; and the porous metal film 204 has a 5% pore rate under a pressure of 75 atm and at a temperature of 350° C. The wafer can be bonded under any of these exemplary sets of bonding conditions.

Step of Removing Underlayer Substrate

Next, the underlayer substrate 101 is removed from the aluminum nitride-based semiconductor wafer 401. The underlayer substrate 101 (e.g., sapphire substrate) can be removed by laser lift-off. For example, a laser beam (wavelength 193 nm) is projected from above the underlayer substrate 101 into the aluminum nitride-based semiconductor wafer 401 as indicated by arrows in FIG. 4. Because the buffer layer 102 has a band gap that is smaller than the energy of 193-nm light and is hence capable of absorbing 193-nm light, this laser beam is absorbed by the buffer layer 102. As a result, most of the energy of the laser beam absorbed by the buffer layer 102 is converted into thermal energy, which decomposes the buffer layer 102 itself under heat. That in turn separates out the underlayer substrate 101 from the segment including from the buffer layer 102 to the conductive support substrate 205, thereby detaching and removing the underlayer substrate 101. The light-emitting layer 104 has an emission peak wavelength as long as from 220 nm to 300 nm inclusive, which is relatively long in comparison with the 193-nm wavelength of the laser beam shone in removing the underlayer substrate 101. Therefore, the laser beam power is so intense that the buffer layer 102 and the first-conductive-type contact layer 103 may fail to absorb all the laser beam or generate abundant thermal energy which would reach the light-emitting region. These thermal energy spillovers could damage the light-emitting layer 104. Therefore, the projected laser beam power and the thickness of the buffer layer 102 need to be adjusted properly so that the projected laser beam is all absorbed by the buffer layer 102 and generates no excess thermal energy. The underlayer substrate 101 may be removed using, apart from the 193-nm laser beam, a laser beam of any wavelength that can be absorbed by the buffer layer 102.

Step of Forming Light Extraction Structure

Figure 5:
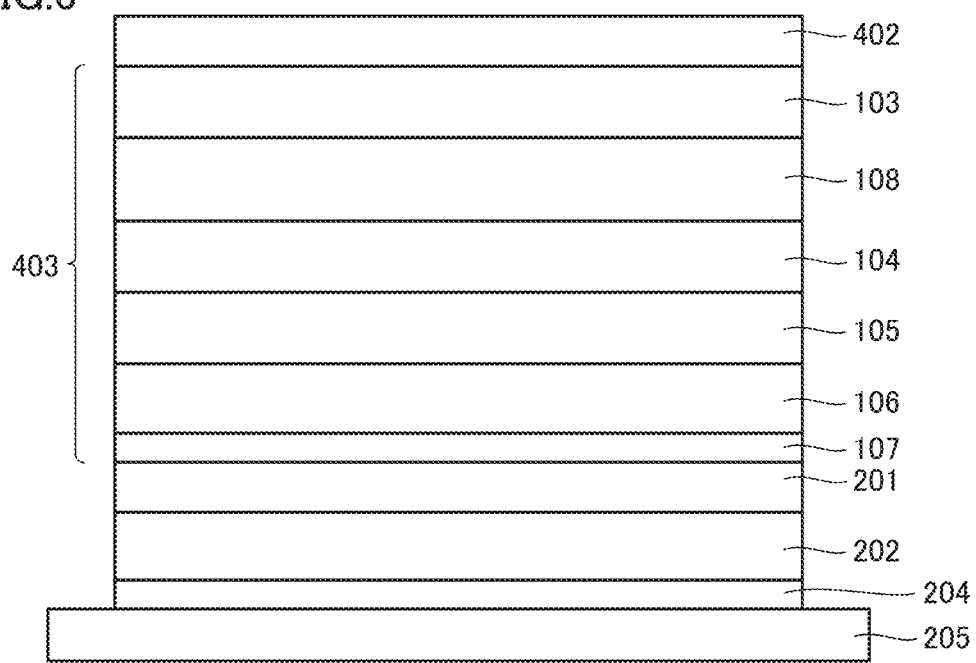
FIG. 5 is a schematic cross-sectional view representing the exemplary aluminum nitride-based semiconductor deep ultraviolet light-emitting device in accordance with Embodiments 1 to 4 of the present invention during the manufacture thereof after the underlayer substrate is removed.
Figure 6:
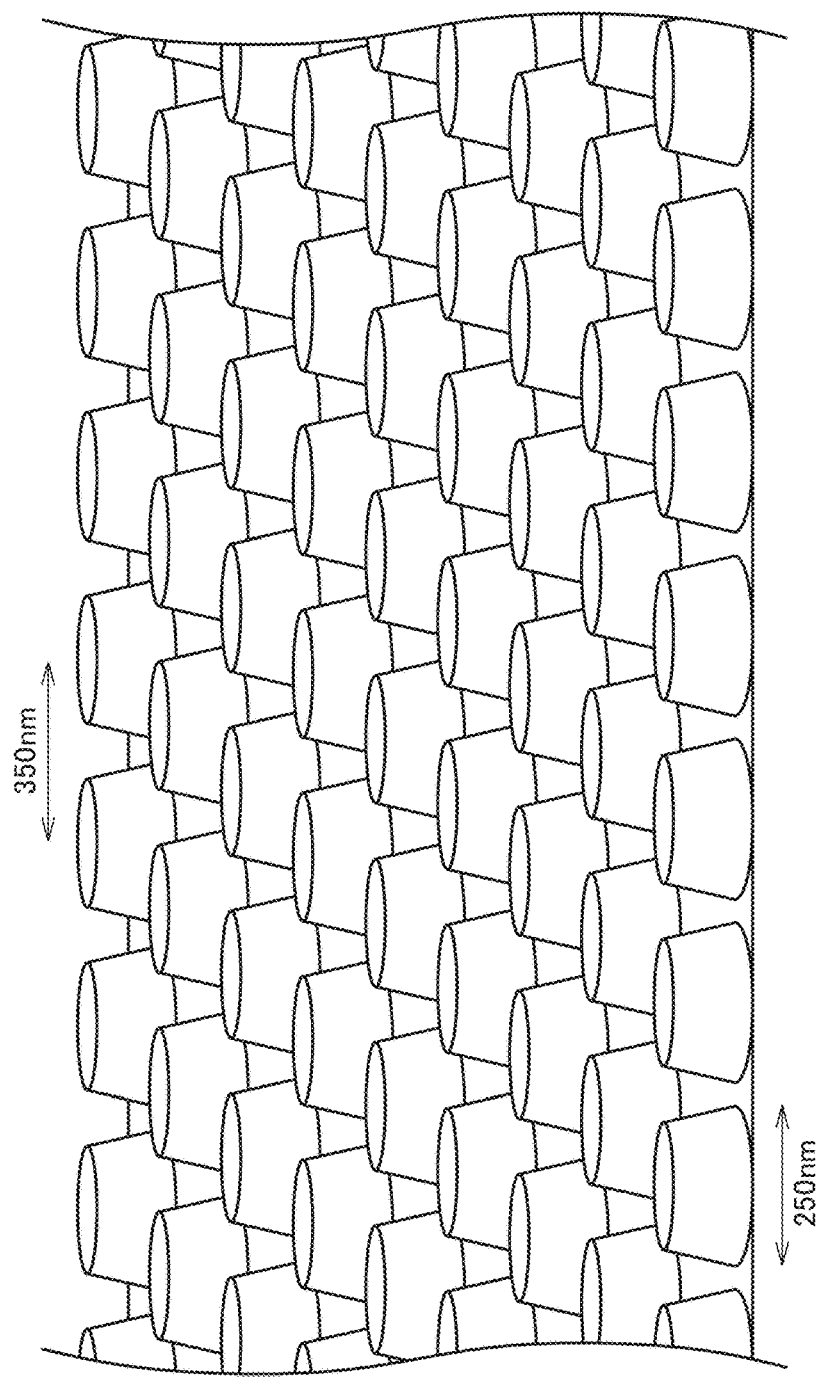
FIG. 6 is a schematic perspective view representing an exemplary light extraction structure of an aluminum nitride-based semiconductor deep ultraviolet light-emitting device in accordance with an embodiment of the present invention.

By removing the underlayer substrate 101 as described above, the wafer shown in FIG. 5 is obtained that includes the aluminum nitride-based semiconductor layer structural body 403. There remains a residual layer 402 that originates from the buffer layer decomposed under the laser radiation, adhering to the separation face at which the underlayer substrate has been detached by the laser radiation. Accordingly, it is desirable that the separation face be cleaned by wet etching using an acid (e.g., hydrochloric acid) and then subjected further to dry etching to make a clean surface out of the first-conductive-type contact layer 103. For example, the wafer is immersed in a hydrochloric acid solution for 3 minutes and then put into RIE (reactive ion etching) apparatus for dry etching to a depth of no greater than approximately 0.5 μm. Additionally, a texture structure may be formed if an electron beam resist pattern for use in forming a texture structure as a light extraction efficiency-enhancing structure (light extraction structure) is formed on the surface of the first-conductive-type contact layer 103 in, for example, electron beam drawing apparatus before the dry etching is performed. FIG. 6 shows an exemplary texture structure as a light extraction structure in a schematic perspective view.

Figure 7:
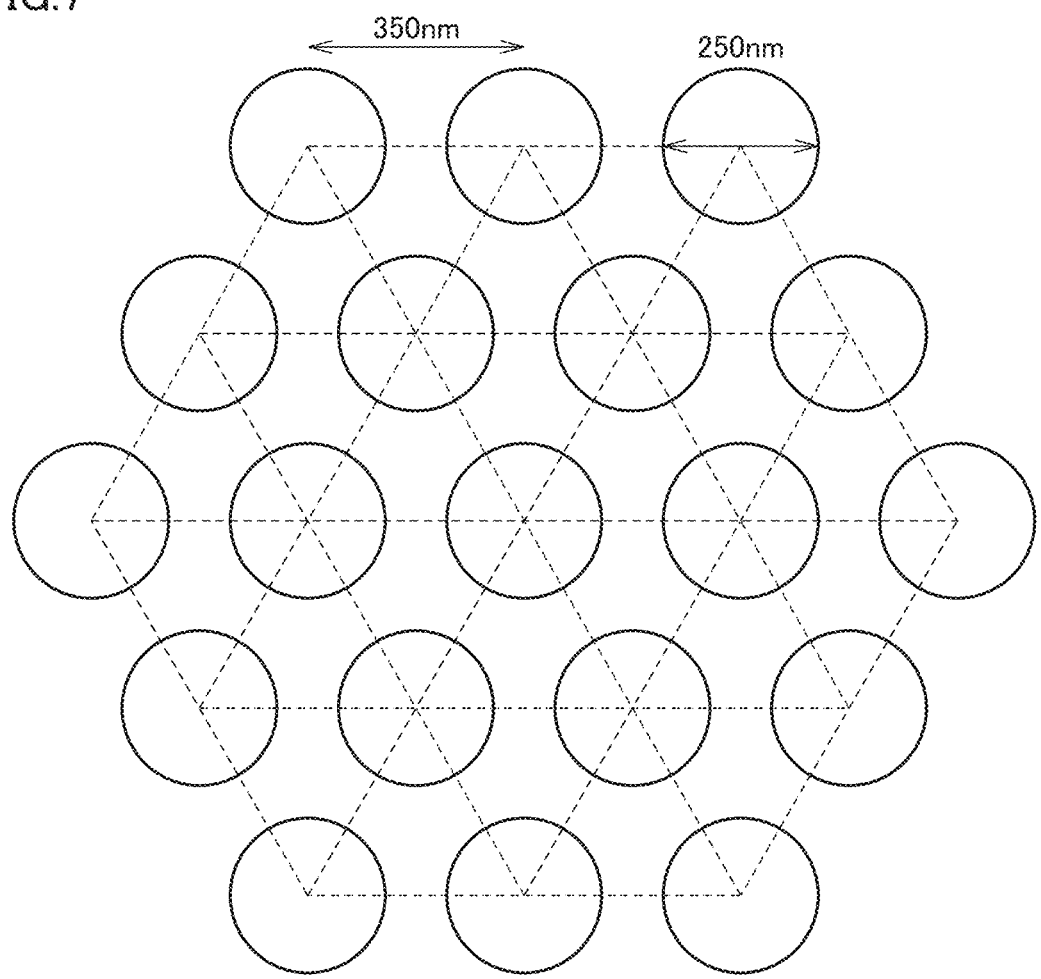
FIG. 7 is a schematic plan view representing an exemplary light extraction structure of the aluminum nitride-based semiconductor deep ultraviolet light-emitting device in accordance with an embodiment of the present invention.

The texture structure shown in FIG. 6 has truncated cone-shaped projections each of which has, for example, a bottom face with a diameter of 250 nm, a top face with a diameter of 225 nm, and a height of 250 nm and which may be periodically arranged so that the centers of the truncated cones can form the apices of equilateral triangles each with three 350 nm sides as shown in the schematic plan view of FIG. 7. This texture structure, although not essential, can improve light extraction efficiency in extracting light from the first-conductive-type contact layer 103. Alternatively, in place of the texture structure, a moth-eye structure or another like low-reflectance structure may be formed on the surface of the n-type AlGaN contact layer to improve the light extraction efficiency.

Step of Forming First-conductive-side Electrodes

Next, as shown in FIG. 1, the first-conductive-side contact electrode 301 is formed on a part of a surface, of the first-conductive-type contact layer 103, on which the texture structure has been formed as a light extraction structure. A resist pattern for use in forming the first-conductive-side contact electrode 301 is formed by photolithography, after which the wafer is put into vapor deposition apparatus for vapor deposition of the first-conductive-side contact electrode layer having a stacked Ti/Al structure. After forming the first-conductive-side contact electrode layer in this manner, the wafer is taken out of the vapor deposition apparatus and stripped of the first-conductive-side contact electrode layer in a lift-off process to form the first-conductive-side contact electrode 301. The first-conductive-side contact electrode 301, following its formation, may be further subjected, if necessary, to ohmic property imparting and electrode alloying heat treatment processes.

If the first-conductive-type $Al_xGa_{1-x}N$ contact layer ($0<x\leq1$), as the first-conductive-type contact layer 103, has an Al composition of greater than 0% and less than 25%, the first-conductive-side contact electrode 301 can relatively readily be rendered ohmic so that no heat treatment may be required. On the other hand, if the Al composition is greater than or equal to 25%, a heat treatment at a temperature as high as 500° C. or at an even higher temperature is necessary to render the first-conductive-side contact electrode 301 ohmic. Furthermore, if the Al composition is greater than or equal to 50%, a heat treatment at a temperature as high as 700° C. or at an even higher temperature is necessary. In the present embodiment, because the first-conductive-type $Al_xGa_{1-x}N$ contact layer ($0<x\leq1$) has a high Al composition of 65%, the first-conductive-side contact electrode is rendered ohmic by heat treating it at 900° C.

In addition, the first-conductive-type $Al_xGa_{1-x}N$ contact layer ($0<x\leq1$) preferably has a higher Al composition than the well layers in the light-emitting layer 104 in order to transmit the light emitted by the light-emitting layer 104. Meanwhile, in the deep ultraviolet light-emitting device with an emission peak wavelength from 220 nm to 300 nm inclusive in accordance with an embodiment of the present invention, the Al compositions of the well layers are approximately 25% when they are the lowest (to achieve an emission peak wavelength of 300 nm). As a result, the Al composition of the first-conductive-type $Al_xGa_{1-x}N$ contact layer ($0<x\leq1$) should be no lower than 25%, which necessitates a 500° C. or higher temperature process to render the first-conductive-side contact electrode ohmic. In this context, the well layers have an Al composition of approximately 45% when the emission peak wavelength is 265 nm and approximately 75% when the emission peak wavelength is 220 nm. The emitted-light-transmitting, first-conductive-side translucent conductive film 304, as the first-conductive-side contact electrode, may be formed on almost the entire first-conductive-type contact layer 103 as shown in FIG. 2.

Next, the first-conductive-side pad electrode 302 is formed on the first-conductive-side contact electrode 301. A resist pattern for use in forming the first-conductive-side pad electrode 302 is formed by photolithography, after which the wafer is put into vapor deposition apparatus for vapor deposition of the first-conductive-side pad electrode layer having a stacked Ti/Au structure. After forming the pad electrode layer in this manner, the wafer is taken out of the vapor deposition apparatus and stripped of the first-conductive-side pad electrode layer in a lift-off process to form the first-conductive-side pad electrode 302 as shown in FIG. 1. As an alternative, the first-conductive-side pad electrode (n-side pad electrode) 302 may be formed on a part of the emitted-light-transmitting, first-conductive-side translucent conductive film 304 as shown in FIG. 2.

Mounting

Next, the wafer carrying thereon the first-conductive-side pad electrode 302 is provided thereon with, for example, a dicing protection film and/or current obstruction layer composed of an insulator such as $SiO_2$ if necessary, and thereafter diced into individual chips of a suitable size (1 mm×1 mm in the present embodiment). The ultraviolet LED chip obtained by the wafer dicing is mounted to a stem or as an SMD (surface mounted device), the first-conductive-side pad electrode 302 and other elements are wired, and the resultant chip is sealed with, for example, an ultraviolet-transmitting resin to obtain an ultraviolet LED device. In the stem, SMD, or any other packaging form, emitted light exits through a face on the first-conductive-side electrode side.

Functions and Effects

In the aluminum nitride-based semiconductor deep ultraviolet light-emitting device of the present embodiment, the porous metal film 204 having a macroporous structure with a pore rate of from 10% to 50% inclusive is used to bond the conductive support substrate 205 and the aluminum nitride-based semiconductor layer structural body 403. Therefore, the porous metal film having a macroporous structure absorbs the stress produced due to differences in thermal expansion coefficient between the conductive support substrate, the aluminum nitride-based semiconductor layer structural body, the porous metal film, and the underlayer substrate. That in turn can restrain the wafer from detaching from the conductive support substrate and cracks from forming in the aluminum nitride-based semiconductor layer structural body and in the porous metal film, thereby improving the yields of the aluminum nitride-based semiconductor deep ultraviolet light-emitting device. Additionally, the porous metal film having a macroporous structure has high temperature resistance, hence allowing for heat treatment at a temperature of 500° C. or higher by which the first-conductive-side contact electrode is rendered ohmic. Thus, the first-conductive-side contact electrode can be formed with good ohmic properties, and the vertically structured, aluminum nitride-based semiconductor deep ultraviolet light-emitting device can be manufactured with a high light emission efficiency and a high yield.

Embodiment 2

Figure 8:
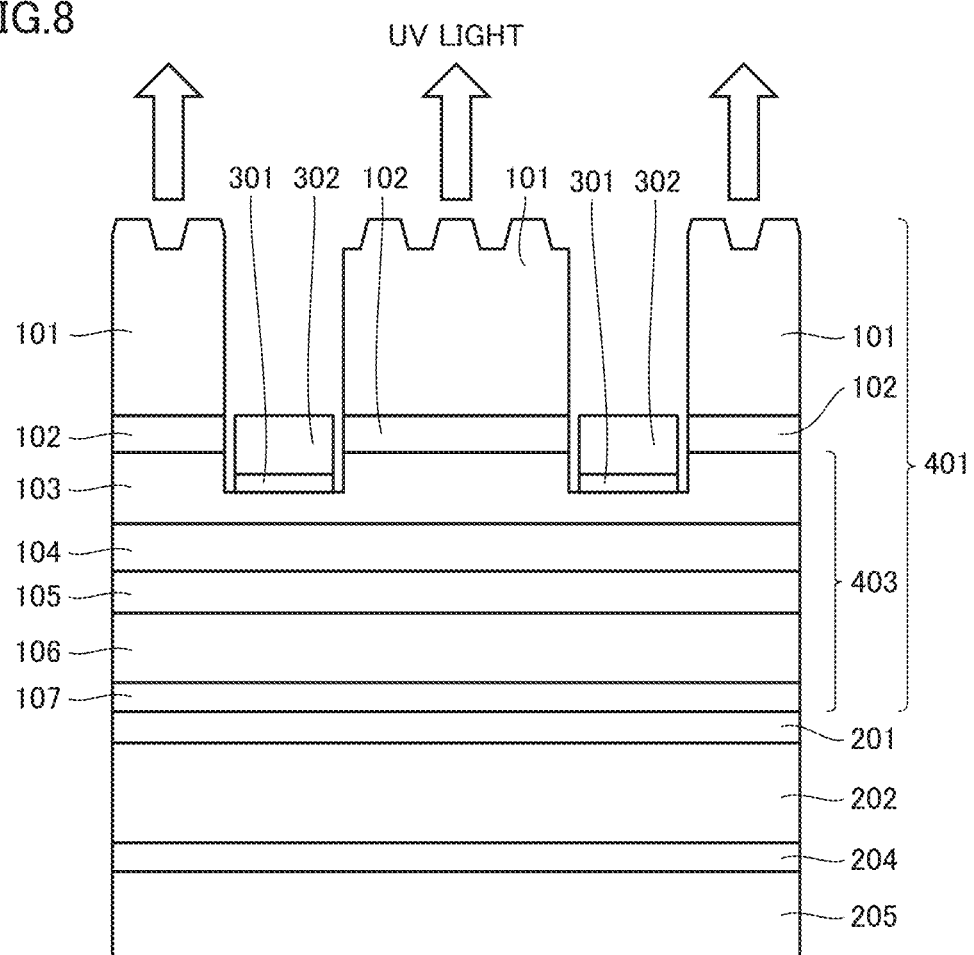
FIG. 8 is a schematic cross-sectional view representing an exemplary aluminum nitride-based semiconductor deep ultraviolet light-emitting device in accordance with Embodiment 2 of the present invention.

Structure of Aluminum Nitride-based Semiconductor Deep Ultraviolet Light-emitting Device Referring to FIG. 8, an aluminum nitride-based semiconductor deep ultraviolet light-emitting device of the present embodiment (this term refers throughout the following description to a light-emitting device that includes an aluminum nitride-based semiconductor layer structural body 403 including a light-emitting layer 104) is vertically structured similarly to the aluminum nitride-based semiconductor deep ultraviolet light-emitting device of Embodiment 1 and further includes an underlayer substrate 101 as an additional substrate bonded to parts of a main face, of the aluminum nitride-based semiconductor layer structural body 403, on which a first-conductive-type contact layer 103 resides. Specifically, the aluminum nitride-based semiconductor deep ultraviolet light-emitting device of the present embodiment includes a conductive support substrate 205, a porous metal film 204 having a conductive macroporous structure with a pore rate of from 10% to 50% inclusive, and the aluminum nitride-based semiconductor layer structural body 403 including the light-emitting layer 104. The conductive support substrate 205 and the aluminum nitride-based semiconductor layer structural body 403 are bonded with the porous metal film 204 interposed therebetween for electrical connection. The aluminum nitride-based semiconductor deep ultraviolet light-emitting device has an emission peak wavelength of from 220 nm to 300 nm inclusive. In this context, the aluminum nitride-based semiconductor layer structural body 403 includes the first-conductive-type contact layer 103, the light-emitting layer 104, and a second-conductive-type contact layer 107 in this sequence. The second-conductive-type contact layer 107 is bonded to the conductive support substrate 205 with the porous metal film 204 interposed therebetween for electrical connection. The aluminum nitride-based semiconductor deep ultraviolet light-emitting device further includes: the underlayer substrate 101 as an additional substrate bonded to parts of the first-conductive-type contact layer 103; and first-conductive-side electrodes (a first-conductive-side contact electrode 301 and a first-conductive-side pad electrode 302) bonded to other parts of the first-conductive-type contact layer 103 for electrical connection. In other words, the first-conductive-side electrodes in the present embodiment are bonded at least to parts of the first-conductive-type contact layer 103 for electrical connection, similarly to those in Embodiment 1.

The aluminum nitride-based ultraviolet light-emitting device of the present embodiment is capable of restraining the aluminum nitride-based semiconductor layer structural body 403 from detaching from the heat-treated, conductive support substrate 205 and cracks from forming in the aluminum nitride-based semiconductor layer structural body 403 and in the porous metal film 204, due to differences in thermal expansion coefficient between the conductive support substrate 205, the aluminum nitride-based semiconductor layer structural body 403, and the porous metal film 204 which is a bonding layer for the conductive support substrate 205 and the aluminum nitride-based semiconductor layer structural body 403. The present embodiment is hence capable of providing a vertically structured, aluminum nitride-based semiconductor deep ultraviolet light-emitting device that exhibits a high light emission efficiency and a high yield.

The aluminum nitride-based light-emitting device of the present embodiment is specifically a vertically structured light-emitting device in which the aluminum nitride-based semiconductor layer structural body 403 is provided on the conductive support substrate 205 with the porous metal film 204 interposed therebetween. The aluminum nitride-based semiconductor layer structural body 403 is a stack of the second-conductive-type contact layer 107, a second-conductive-type layer 106, a second-conductive-type block layer 105, the light-emitting layer 104, and the first-conductive-type contact layer 103 provided in this sequence. The porous metal film 204 has a conductive macroporous structure with a pore rate of from 10% to 50% inclusive. The underlayer substrate 101 is disposed so as to be bonded to parts of the first-conductive-type contact layer 103. The first-conductive-side contact electrode 301 is disposed so as to be bonded to other parts of the first-conductive-type contact layer 103 for electrical connection.

The conductive support substrate 205, the aluminum nitride-based semiconductor layer structural body 403, and the porous metal film 204 in the aluminum nitride-based ultraviolet light-emitting device of the present embodiment are the same as the conductive support substrate 205, the aluminum nitride-based semiconductor layer structural body 403, and the porous metal film 204 in the aluminum nitride-based ultraviolet light-emitting device of Embodiment 1 respectively.

Underlayer Substrate

The underlayer substrate 101 in the aluminum nitride-based ultraviolet light-emitting device of the present embodiment is used to form the aluminum nitride-based semiconductor layer structural body 403 and is preferably a sapphire substrate in view of its capability of transmitting deep ultraviolet light of wavelengths of from 220 nm to 300 nm inclusive and in order to form the aluminum nitride-based semiconductor layer structural body 403 with high quality.

Method of Manufacturing Aluminum Nitride-based Semiconductor Deep Ultraviolet
Light-emitting Device The method of manufacturing the aluminum nitride-based light-emitting device of the present embodiment is not limited in any particular manner, and in view of efficient manufacturing, preferably includes: a step of forming an aluminum nitride-based semiconductor layer structural body on an underlayer substrate; a step of activating second-conductive-type layers (namely, the second-conductive-type block layer 105, the second-conductive-type layer 106, and the second-conductive-type contact layer 107); a step of forming a second-conductive-side electrode and a reflective electrode; a step of bonding a conductive support substrate using a porous metal film; a step of removing parts of the underlayer substrate; a step of exposing a first-conductive-type contact layer; a step of forming first-conductive-side electrodes (a first-conductive-side contact electrode and a first-conductive-side pad electrode); and a step of forming a light extraction structure.

From Step of Forming Aluminum Nitride-based Semiconductor Layer Structural Body on Underlayer Substrate through Step of Bonding Conductive Support Substrate Using Porous Metal Film The step of forming an aluminum nitride-based semiconductor layer structural body on an underlayer substrate, the step of activating second-conductive-type layers (namely, the second-conductive-type block layer 105, the second-conductive-type layer 106, and the second-conductive-type contact layer 107), the step of forming a second-conductive-side electrode and a reflective electrode, and the step of bonding a conductive support substrate using a porous metal film are the same as for the aluminum nitride-based semiconductor deep ultraviolet light-emitting device of Embodiment 1.

Step of Removing Parts of Underlayer Substrate

After the aluminum nitride-based semiconductor wafer 401 and the conductive support substrate 205 are bonded using the porous metal film 204, parts of the underlayer substrate 101 are removed from the aluminum nitride-based semiconductor wafer 401. This partial removal of the underlayer substrate 101 can be performed by laser lift-off similarly to Embodiment 1. In the present embodiment, a laser beam (wavelength 193 nm) is projected only into the parts of the aluminum nitride-based semiconductor wafer where the underlayer substrate 101 is to be removed. Hence, those parts of the sapphire substrate which are placed under the laser radiation are removed. There are no changes to laser radiation conditions from Embodiment 1, except for the laser radiation area.

Step of Exposing First-conductive-type Contact Layer

Figure 9:
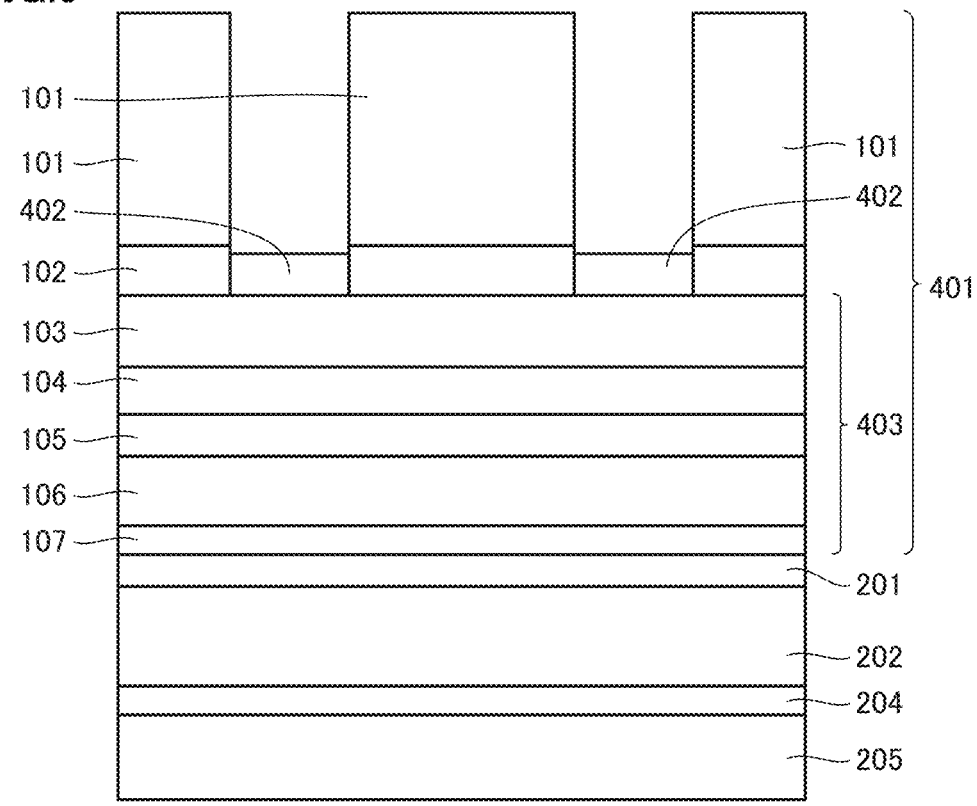
FIG. 9 is a schematic cross-sectional view representing an exemplary aluminum nitride-based semiconductor deep ultraviolet light-emitting device in accordance with another embodiment of the present invention during the manufacture thereof after an underlayer substrate is removed.

After the partial removal of the underlayer substrate, there remains a residual layer 402 that originates from a buffer layer 102 decomposed under the laser radiation, adhering to where the underlayer substrate 101 has been removed under the laser radiation as shown in FIG. 9. Accordingly, it is desirable that the separation face be cleaned by wet etching using an acid (e.g., hydrochloric acid) and then subjected further to dry etching to make a clean surface out of the first-conductive-type contact layer 103. For example, the wafer is immersed in a hydrochloric acid solution for 3 minutes and then put into RIE, (reactive ion etching) apparatus for dry etching to a depth of no greater than approximately 0.5 μm.

Subsequently, as shown in FIG. 8, where the underlayer substrate 101 has been removed, the first-conductive-type contact layer 103, which is an n-type $Al_{0.65}Ga_{0.35}N$ contact layer, is exposed by dry etching to form first-conductive-type regions. A resist pattern for use in forming the first-conductive-type regions is formed by photolithography, after which the wafer is put into ICP dry etching apparatus for dry etching to expose to a depth of approximately 1.0 μm from the surface of the first-conductive-type contact layer 103. After exposing the first-conductive-type contact layer 103 in this manner, the resist mask for the dry etching and other unnecessary elements are removed, and the wafer is cleaned by organic washing.

Step of Forming First-conductive-side Electrodes

The first-conductive-side electrodes (the first-conductive-side contact electrode 301 and the first-conductive-side pad electrode 302) are formed on the exposed and washed parts of the first-conductive-type contact layer 103. The first-conductive-side contact electrode 301 and the first-conductive-side pad electrode 302 are formed by the same processes as for the aluminum nitride-based semiconductor deep ultraviolet light-emitting device of Embodiment 1. In the present embodiment, because the first-conductive-type contact layer 103 has a high Al composition of 0.65, the first-conductive-side contact electrode 301 is rendered ohmic by heat treating it at 900° C. before forming the first-conductive-side pad electrode 302, similarly to Embodiment 1.

Step of Forming Extraction Structure

Next, a texture structure may be formed by dry etching after an electron beam resist pattern or a resin pattern for use in forming a texture structure is formed on the surface of the underlayer substrate 101 in, for example, electron beam drawing apparatus or nano-imprint apparatus or by using a resin mold. FIG. 5 shows an exemplary texture structure in a schematic perspective view as in Embodiment 1. This texture structure, although not essential, can improve light extraction efficiency in extracting light from the underlayer substrate 101. Alternatively, in place of the texture structure, a moth-eye structure or another like low-reflectance structure may be formed on the surface of a growth substrate to improve the light extraction efficiency.

Mounting

Next, similarly to Embodiment 1, the wafer is diced into individual chips of a suitable size (1 mm×1 mm in the present embodiment). The chip is mounted to a stem or as an SMD (surface mounted device), the first-conductive-side pad electrode 302 and other elements are wired, and the resultant chip is sealed with, for example, an ultraviolet-transmitting resin to obtain an ultraviolet LED device. Emitted light exits through a main face of the first-conductive-type contact layer 103 on the first-conductive-side electrode side.

The aluminum nitride-based semiconductor deep ultraviolet light-emitting device of the present embodiment described above includes an underlayer substrate as an additional substrate. The additional substrate in the aluminum nitride-based semiconductor deep ultraviolet light-emitting device of the present embodiment, however, is not limited in any particular manner provided that it is insulating and transparent, and it does not need to be an underlayer substrate. For example, similarly to Embodiment 1, the underlayer substrate may be entirely removed from the first-conductive-type contact layer side, so that first-conductive-side electrodes first-conductive-side contact electrode and a first-conductive-side pad electrode) can be formed on parts of the first-conductive-type contact layer and that an insulating transparent substrate as an additional substrate can be bonded to other parts of the first-conductive-type contact layer. In this context, the insulating transparent substrate is preferably a sapphire substrate in view of its capability of transmitting deep ultraviolet light of wavelengths of from 220 nm to 300 nm inclusive.

Functions and Effects

The aluminum nitride-based semiconductor deep ultraviolet light-emitting device of the present embodiment is vertically structured similarly to the aluminum nitride-based semiconductor deep ultraviolet light-emitting device of Embodiment 1 and also includes an additional substrate bonded to parts of a main face, of the aluminum nitride-based semiconductor layer structural body 403, on which the first-conductive-type contact layer 103 resides. The aluminum nitride-based semiconductor deep ultraviolet light-emitting device of the present embodiment therefore achieves the same functions and effects as the aluminum nitride-based semiconductor deep ultraviolet light-emitting device of Embodiment 1. The present embodiment is hence capable of providing a vertically structured, aluminum nitride-based semiconductor deep ultraviolet light-emitting device that exhibits a high light emission efficiency and a high yield.

Embodiment 3

Figure 10:
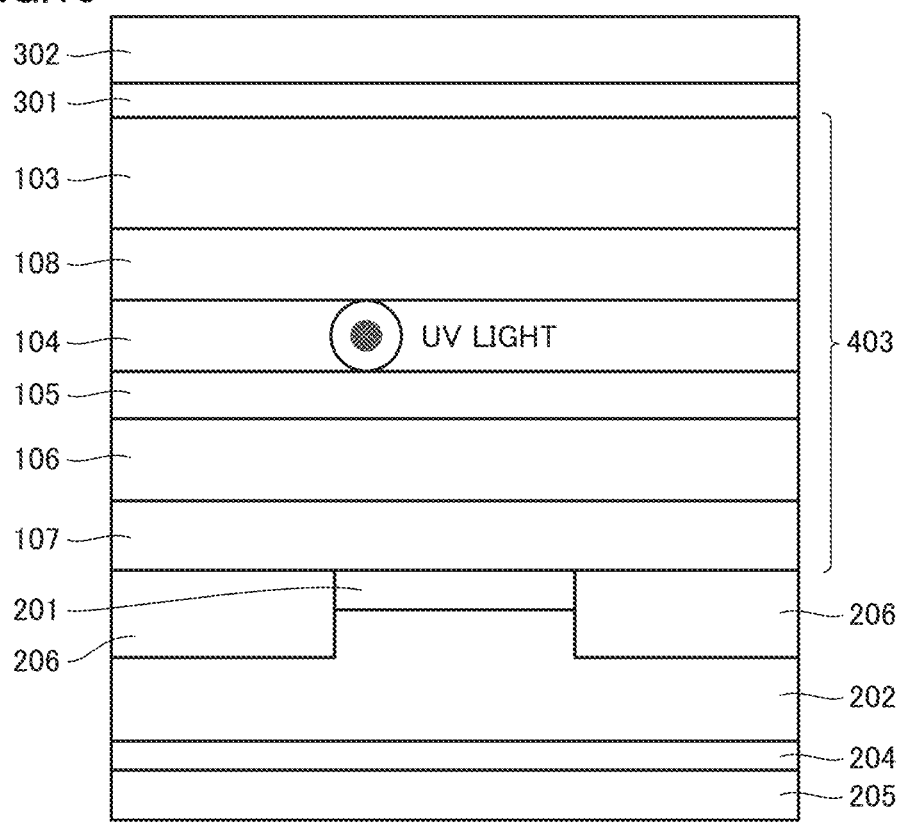
FIG. 10 is a schematic cross-sectional view representing an exemplary aluminum nitride-based semiconductor deep ultraviolet light-emitting device in accordance with Embodiment 3 of the present invention.
Figure 11:
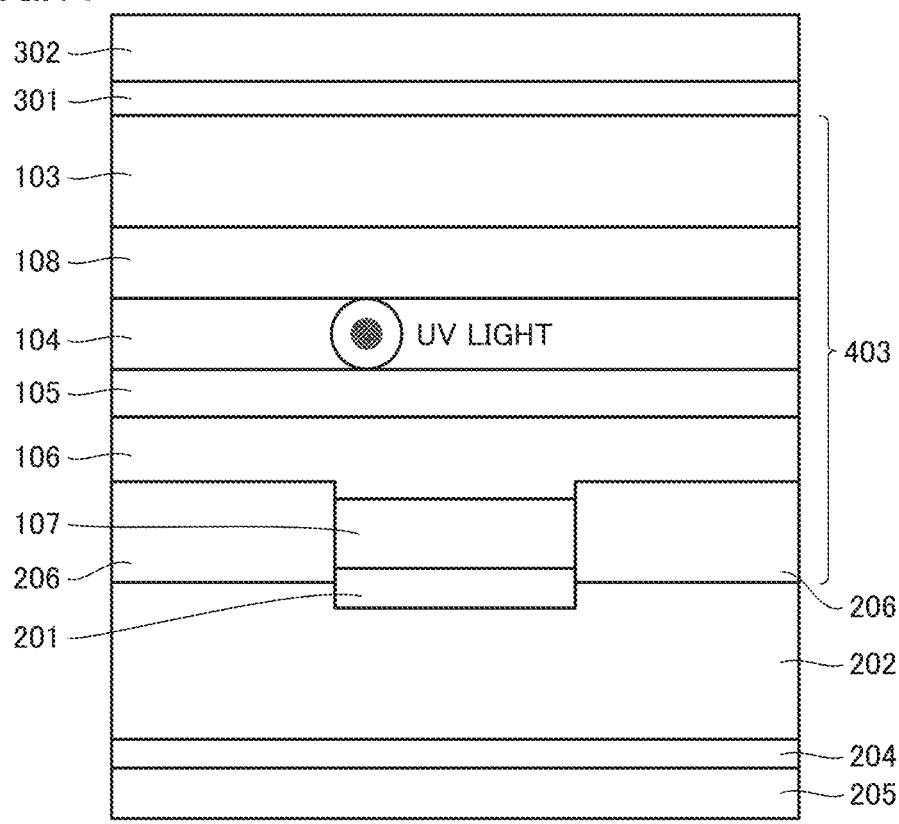
FIG. 11 is a schematic cross-sectional view representing another exemplary aluminum nitride-based semiconductor deep ultraviolet light-emitting device in accordance with Embodiment 3 of the present invention.

Referring to FIGS. 10 and 11, an aluminum nitride-based semiconductor deep ultraviolet light-emitting device of the present embodiment is vertically structured and stripped of the entire underlayer substrate used to form an aluminum nitride-based semiconductor layer structural body 403 similarly to Embodiment 1, and emits light through an edge thereof. Examples of edge-emitting LEDs include laser diodes (LDs), superluminescent diodes (SLDs), and other stimulated emission LEDs.

Therefore, the aluminum nitride-based semiconductor deep ultraviolet light-emitting device of the present embodiment includes, similarly to Embodiment 1, a conductive support substrate 205, a porous metal film 204 having a conductive macroporous structure with a pore rate of from 10% to 50% inclusive, and the aluminum nitride-based semiconductor layer structural body 403 including a light-emitting layer 104. The conductive support substrate 205 and the aluminum nitride-based semiconductor layer structural body 403 are bonded with the porous metal film 204 interposed therebetween for electrical connection. The aluminum nitride-based semiconductor deep ultraviolet light-emitting device has an emission peak wavelength of from 220 nm to 300 nm inclusive. In this context, the aluminum nitride-based semiconductor layer structural body 403 includes a first-conductive-type contact layer 103, the light-emitting layer 104, and a second-conductive-type contact layer 107 in this sequence. The second-conductive-type contact layer 107 is bonded to the conductive support substrate 205 with the porous metal film 204 interposed therebetween for electrical connection. The aluminum nitride-based semiconductor deep ultraviolet light-emitting device further includes first-conductive-side electrodes (a first-conductive-side contact electrode 301 and a first-conductive-side pad electrode 302) bonded at least to a part of the first-conductive-type contact layer 103 (the entire surface, of the first-conductive-type contact layer 103, that forms a main face of the first-conductive-type contact layer 103 in FIGS. 10 and 11) for electrical connection.

The aluminum nitride-based semiconductor deep ultraviolet light-emitting device of the present embodiment is configured similarly to Embodiment 1, and additionally, to achieve suitable light confinement effects, preferably includes, as a guide layer and/or a cladding layer, a first-conductive-type layer 108 and a second-conductive-type layer 106 each having a multilayer structure of layers of different Al compositions and to facilitate stimulated emission, preferably includes a structure, built before the bonding of an aluminum nitride-based semiconductor wafer 401 to the conductive support substrate 205, that restricts current paths on the p side (second conductive side). Specifically, as shown in FIG. 10, a second-conductive-side contact electrode 201 may be formed only on some parts so that an insulating layer 206 can be provided where no second-conductive-side contact electrode 201 is formed, in order to form a stripe electrode structure. Alternatively, as shown in FIG. 11, some parts of the second-conductive-type contact layer 107 and adjacent parts of the second-conductive-type layer 106 may be etched away so that an insulating layer 206 can be accommodated to form a ridge stripe structure.

Following the formation of the stripe electrode structure or ridge stripe structure, all the steps from the bonding of the aluminum nitride-based semiconductor wafer 401 to the conductive support substrate 205 through the formation of the first-conductive-side pad electrode 302 are performed similarly to Embodiment 1. The first-conductive-side electrodes (the first-conductive-side contact electrode 301 and the first-conductive-side pad electrode 302) may be either formed across the whole exposed surface of the first-conductive-type contact layer 103 as shown in 10 and 11 or formed by patterning only on some parts of the exposed surface of the first-conductive-type contact layer similarly to Embodiment 1.

Mounting

Next, the wafer carrying thereon the first-conductive-side pad electrode 302 is cleaved and/or diced into bars. To obtain a semiconductor laser diode, one of cleaved faces is subjected to a high reflection coating process to form a light-reflecting face, and the other cleaved face is subjected to, for example, a low reflection coating process and a protective coating process in accordance with an intended use, to form a laser exit face. To obtain a superluminescent diode, a low reflection coating, a non-flat, irregular surface, an inclined surface, and/or another edge reflection-lowering structure are formed on the edge to prevent lasing. After this edge processing, the bar is separated into individual chips of a suitable size (0.8 mm×0.4 mm in the present embodiment). The edge-emitting LED chip obtained by the wafer dicing is mounted to a stem, the first-conductive-side pad electrode and other elements are wired, and the resultant chip is sealed with, for example, an ultraviolet-transmitting resin to obtain an edge-emitting ultraviolet LED.

Functions and Effects

The aluminum nitride-based semiconductor deep ultraviolet light-emitting device of the present embodiment is an edge-emitting LED having a vertical structure in which some current paths are restricted so that stimulated emission can readily occur and from which the underlayer substrate is entirely removed. The present embodiment achieves functions and effects that are similar to those achieved in Embodiment 1 and is hence capable of providing a vertically structured, aluminum nitride-based semiconductor deep ultraviolet light-emitting device that exhibits a high light emission efficiency and a high yield.

Embodiment 4

Figure 12:
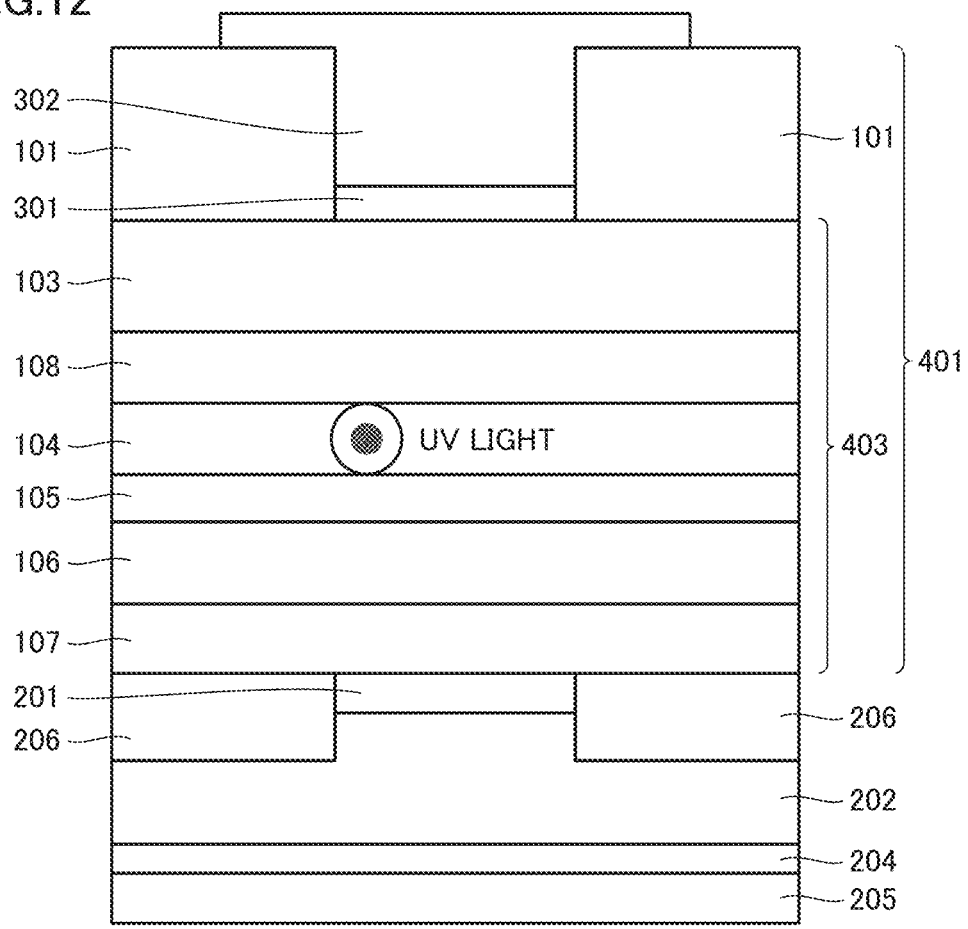
FIG. 12 is a schematic cross-sectional view representing an exemplary aluminum nitride-based semiconductor deep ultraviolet light-emitting device in accordance with Embodiment 4 of the present invention.
Figure 13:
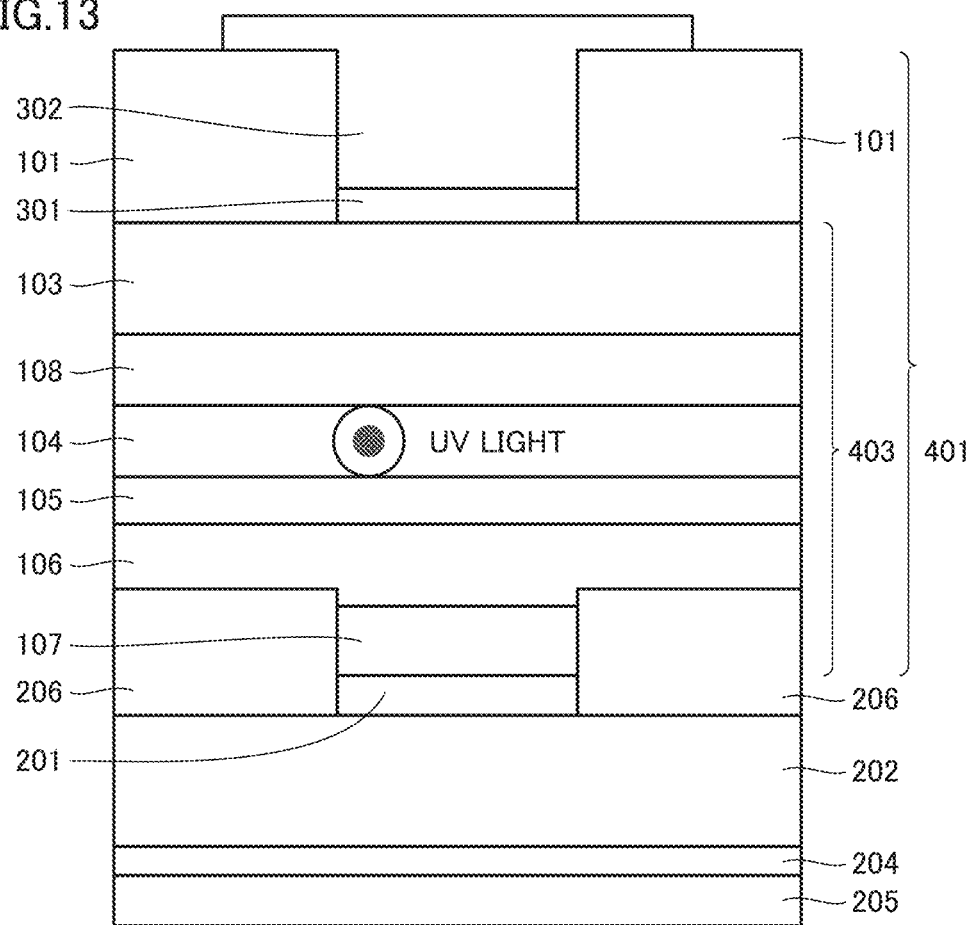
FIG. 13 is a schematic cross-sectional view representing another exemplary aluminum nitride-based semiconductor deep ultraviolet light-emitting device in accordance with Embodiment 4 of the present invention.

Referring to FIGS. 12 and 13, an aluminum nitride-based semiconductor deep ultraviolet light-emitting device of the present embodiment is vertically structured similarly to the aluminum nitride-based semiconductor deep ultraviolet light-emitting device of Embodiment 3, further includes an underlayer substrate 101 as an additional substrate bonded to parts of a main face, of an aluminum nitride-based semiconductor layer structural body 403, on which a first-conductive-type contact layer 103 resides, and is of the same edge-emitting type as in Embodiment 3. Examples of edge-emitting LEDs include semiconductor lasers (LDs), super-luminescent diodes (SLDs), and other stimulated emission LEDs.

Therefore, the aluminum nitride-based semiconductor deep ultraviolet light-emitting device of the present embodiment includes, similarly to Embodiment 2, a conductive support substrate 205, a porous metal film 204 having a conductive macroporous structure with a pore rate of from 10% to 50% inclusive, and the aluminum nitride-based semiconductor layer structural body 403 including a light-emitting layer 104. The conductive support substrate 205 and the aluminum nitride-based semiconductor layer structural body 403 are bonded with the porous metal film 204 interposed therebetween for electrical connection. The aluminum nitride-based semiconductor deep ultraviolet light-emitting device has an emission peak wavelength of from 220 nm to 300 nm inclusive. In this context, the aluminum nitride-based semiconductor layer structural body 403 includes the first-conductive-type contact layer 103, the light-emitting layer 104, and a second-conductive-type contact layer 107 in this sequence. The second-conductive-type contact layer 107 is bonded to the conductive support substrate 205 with the porous metal film 204 interposed therebetween for electrical connection. The aluminum nitride-based semiconductor deep ultraviolet light-emitting device further includes: the underlayer substrate 101 bonded to parts of the first-conductive-type contact layer 103; and first-conductive-side electrodes (a first-conductive-side contact electrode 301 and a first-conductive-side pad electrode 302) bonded to other parts of the first-conductive-type contact layer 103 for electrical connection. In other words, the first-conductive-side electrodes in the present embodiment are bonded at least to parts of the first-conductive-type contact layer 103 for electrical connection, similarly to those in previous embodiments.

The aluminum nitride-based semiconductor deep ultraviolet light-emitting device of the present embodiment is configured similarly to Embodiment 2, and additionally, to achieve suitable light confinement effects, preferably includes, as a guide layer and/or a cladding layer, a first-conductive-type layer 108 and a second-conductive-type layer 106 each having a multilayer structure of layers of different Al compositions and to facilitate stimulated emission, preferably includes a structure, built before the bonding of an aluminum nitride-based semiconductor wafer 401 to the conductive support substrate 205, that restricts current paths on the p side (second conductive side). Specifically, as shown in FIG. 12, a second-conductive-side contact electrode 201 may be formed only on some parts so that an insulating layer 206 can be provided where no second-conductive-side contact electrode 201 is formed, in order to form a stripe electrode structure. Alternatively, as shown in FIG. 13, some parts of the second-conductive-type contact layer 107 and adjacent parts of the second-conductive-type layer 106 may be etched away so that an insulating layer 206 can be accommodated to form a ridge stripe structure.

The aluminum nitride-based semiconductor deep ultraviolet light-emitting device of the present embodiment described above includes an underlayer substrate as an additional substrate. The additional substrate in the aluminum nitride-based semiconductor deep ultraviolet light-emitting device of the present embodiment, however, is not limited in any particular manner provided that it is insulating, and it does not need to be an underlayer substrate. For example, similarly to Embodiment 3, the underlayer substrate may be entirely removed from the first-conductive-type contact layer side, so that first-conductive-side electrodes (a first-conductive-side contact electrode and a first-conductive-side pad electrode) can be formed on parts of the first-conductive-type contact layer and that an insulating substrate as an additional substrate can be bonded to other parts of the first-conductive-type contact layer. In this context, the insulating substrate is preferably a sapphire substrate in view of resultant suitable light confinement effects and suppressed current leak.

Following the formation of the stripe electrode structure or ridge stripe structure, similarly to Embodiment 3, the wafer is cleaved and/or diced into bars. After suitable edge processing, the bar is separated into individual chips and mounted to a stem, the first-conductive-side pad electrode and other elements are wired, and the resultant chip is sealed with, for example, an ultraviolet-transmitting resin to obtain an edge-emitting ultraviolet LED.

Functions and Effects

The aluminum nitride-based semiconductor deep ultraviolet light-emitting device of the present embodiment is vertically structured similarly to the aluminum nitride-based semiconductor deep ultraviolet light-emitting device of Embodiment 3 and further includes an additional substrate bonded to parts of a main face, of the aluminum nitride-based semiconductor layer structural body 403, on which the first-conductive-type contact layer 103 resides. The aluminum nitride-based semiconductor deep ultraviolet light-emitting device of the present embodiment therefore achieves the same functions and effects as the aluminum nitride-based semiconductor deep ultraviolet light-emitting device of Embodiment 3. The present embodiment achieves functions and effects that are similar to those achieved in Embodiment 1 and is hence capable of providing a vertically structured, aluminum nitride-based semiconductor deep ultraviolet light-emitting device that exhibits a high light emission efficiency and a high yield.

EXAMPLES OF THE INVENTION

Example 1

Referring to FIG. 3, a sapphire substrate as an underlayer substrate 101 was put into MOCVD apparatus where a buffer layer 102 composed of a 300-nm thick AlN layer, a first-conductive-type contact layer 103 composed of a 3-μm thick, n-type $Al_{0.65}Ga_{0.35}N$ layer, a light-emitting layer 104 having a multiple quantum well structure of 6 cycles of 3-nm thick $Al_{0.80}Ga_{0.20}N$ barrier layers and 2-nm thick $Al_{0.55}Ga_{0.45}N$ well layers, a second-conductive-type block layer 105 composed of a 15-nm thick, p-type $Al_{0.85}Ga_{0.15}N$ block layer, a second-conductive-type layer 106 composed of a 150-nm thick, p-type $Al_{0.65}Ga_{0.35}N$ layer, and a secondconductive-type contact layer 107 composed of a 50-nm thick, p-type $Al_{0.25}Ga_{0.75}N$ contact layer were stacked in this sequence on a main face of the sapphire substrate to obtain an aluminum nitride-based semiconductor wafer 401. A first-conductive-type layer 108, although shown in FIG. 3, was omitted in the present example.

In the present example, the AlN-based semiconductor layer crystal was grown by MOCVD. A known, non-MOCVD crystal growth method, such as MBE or sputtering, may partly or entirely have been used. The buffer layer 102 may have been, for example, a non-doped $Al_xGa_{1-x}N$ layer ($0<x\le1$) or an n-type $Al_xGa_{1-x}N$ layer ($0<x\le1$) and was preferably any layer that sufficiently absorbed laser beams in a laser lift-off step in which the underlayer substrate 101 was removed.

After completion of crystal growth in the MOCVD apparatus, the wafer including a stacked aluminum nitride-based semiconductor layer was taken out of the MOCVD apparatus and subjected to a heat treatment to activate second-conductive-type (p-type) layers (a second-conductive-type block layer 105, a second-conductive-type layer 106, and a second-conductive-type contact layer 107). The heat treatment was done by putting the aluminum nitride-based semiconductor wafer 401 into heat treatment apparatus and keeping the wafer 401 in an 100% oxygen atmosphere at a temperature as high as 900° C. for 10 minutes. The heat treatment may have been done at a different temperature and/or in a different atmosphere.

Subsequently, a p-side electrode (second-conductive-side electrode) was formed. The wafer was put into vapor deposition apparatus where a second-conductive-side contact electrode 201 was formed on a p-type $Al_{0.25}Ga_{0.75}N$ contact layer as the second-conductive-type contact layer 107 as shown in FIG. 4, the electrode 201 being composed of a p-type contact electrode made of a 15-nm thick Ni layer and a 15-nm thick Au layer. A first-conductive-type layer 108, although shown in FIG. 4, was omitted in the present example as mentioned earlier. To suppress light absorption by the second-conductive-side contact electrode 201, the transmittance of the second-conductive-side contact electrode 201 at the emission wavelength needed to be as high as possible and was preferably 75% or higher. The second-conductive-side contact electrode 201 in the present example was a 30-nm thick metal layer composed of a 15-nm thick Ni layer and a 15-nm thick Au layer to fulfill this condition. In the present example, the two Ni and Au layers, each 15 nm thick, were formed, after which an alloying process was performed on the second-conductive-side contact electrode 201 through a heat treatment in an oxygen-containing atmosphere at 450° C. This heat treatment enabled improvement of the transmittance of the second-conductive-side contact electrode 201 and improvement of the ohmic properties of the second-conductive-type contact layer 107.

Subsequently, the aluminum nitride-based semiconductor wafer 401 carrying thereon the second-conductive-side contact electrode 201 was bonded to a conductive support substrate 205. The conductive support substrate 205 was a conductive silicon substrate that had been doped for conductivity. The silicon substrate preferably had its bonding face equipped with a metal electrode in advance. This was however not the only possibility. Alternatively, the aluminum nitride-based semiconductor wafer 401 carrying thereon the second-conductive-side contact electrode 201 may have been bonded directly to a face of the silicon substrate. The bonding face of the silicon substrate in the present example was a silicon substrate/Ni layer (25 nm)/Au layer (250 nm) that was prepared by forming Ni and Au metal films on the silicon substrate.

Subsequently, a conductive paste blended with metal particles was applied to the bonding face, of the conductive support substrate 205, on which the Ni and Au metal films had been formed. In the present example, a silver-containing conductive paste was applied using a screen printer. The silver-containing conductive paste used in the present example was adjusted in terms of silver content, density, clay, composition, and other factors in view of the wafer bonding conditions of the present example, so that the conductive paste could come to have a macroporous structure after sintering. The paste exhibited a high wafer bonding strength and a high conductivity after the bonding was performed under the wafer bonding conditions of the present example. The silver-containing conductive paste was applied to a thickness of approximately a few dozen micrometers. The thickness changed significantly in the sintering, depending on temperature, pressure, and other sintering conditions.

Subsequently, referring to FIG. 4, the aluminum nitride-based semiconductor wafer 401 carrying thereon the second-conductive-side contact electrode 201 (p-type contact electrode) was mounted and bonded to the bonding face of the conductive support substrate 205 to which the silver-containing conductive paste had been applied in such a manner that the face of the wafer 401 on which the second-conductive-side contact electrode 201 resided could come into contact with the conductive paste. The bonding was done in thermocompression apparatus. In the present example, the conductive support substrate 205 and the aluminum nitride-based semiconductor wafer 401 were able to be bonded with a porous metal film 204 having a macroporous structure interposed therebetween through compression in a nitrogen atmosphere, under 50 atm, and at 350° C. for 60 minutes. The post-bonding pore rate of the porous metal film 204 was calculated as follows. A percentage of the pores' cross-sectional area to the whole cross-sectional area (pore area ratio) was obtained from observation of each of three cross-sections of the porous metal film 204 by SEM (scanning electron microscopy). The three pore area ratios were raised to the power of 3/2, and the resultant three numeric values were averaged to obtain the post-bonding pore rate. The pore rate was approximately from 10% to 25%, and its average value was 20%.

The bonding conditions were analyzed by varying the pressure from 1 atm to 100 atm and the temperature from 200° C. to 350° C. The porous metal film 204 exhibited a pore rate of 50% when the pressure was 5 atm, and the temperature was 225° C. The porous metal film 204 exhibited a pore rate of 5% when the pressure was 75 atm, and the temperature was 350° C. The wafer was able to be bonded under either of these sets of bonding conditions. The bonding conditions were also analyzed by setting the pressure to normal pressure (pressure equaled to 1 atm). Under these conditions, the porous metal film 204 exhibited a pore rate of no less than 50% irrespective of the temperature. The wafer was able to be bonded also under any of these sets of conditions. If the pressure was from 80 atm to 100 atm inclusive, the porous metal film 204 exhibited a pore rate of approximately 0%, and no macroporous structure could be verified in SEM images. The wafer was able to be bonded also under any of these sets of conditions.

The reflectance of the post-bonding porous metal film was also measured. It turned out that the post-bonding porous metal film had a reflectance of approximately 75% or higher for light of 360 nm or shorter wavelengths, irrespective of the presence/absence of a macroporous structure. It was thus confirmed that the porous metal film could serve as a reflective film for ultraviolet light.

Therefore, in the present example, the porous metal film 204 was bonded directly to the second-conductive-side contact electrode 201, and the porous metal film 204 was given a double role as a reflective electrode 202 and a conductive bonding layer. An alternative conductive bonding layer could however have been obtained by forming the reflective electrode 202 from a metal with a high reflectance for ultraviolet light, such as aluminum or silver, on the second-conductive-side contact electrode 201 and then forming the porous metal film 204.

The underlayer substrate 101 was removed from the aluminum nitride-based semiconductor wafer 401 after the bonding. In the present example, the underlayer substrate 101 was removed by laser lift-off. A laser beam (wavelength 193 nm) was projected from above the underlayer substrate 101 into the aluminum nitride-based semiconductor wafer 401 as shown in FIG. 4. The projected laser beam was all absorbed by the buffer layer 102. The absorbed laser beam's light energy was converted to thermal energy, which in turn decomposed the buffer layer 102. The underlayer substrate 101 was hence detached and removed, and the segment including from the first-conductive-type contact layer 103 to the conductive support substrate 205 was successfully separated out.

Referring to FIG. 5, there remained a residual layer 402 that originated from the buffer layer 102 decomposed under the laser radiation, adhering to the detachment face at which the substrate had been removed by the laser radiation. Accordingly; the detachment face was cleaned. A first-conductive-type layer 108, although shown in FIG. 5, was omitted in the present example as mentioned earlier. Specifically, the separated wafer was immersed in a 1:1 mixture of hydrochloric acid and water for 3 minutes. Thereafter, the wafer was washed in water, dried, and then subjected to dry etching to remove a part of the surface layer of the first-conductive-type contact layer 103 to a depth of approximately 0.50 μm, to make a clean surface out of the first-conductive-type contact layer 103.

In the dry etching process above, a texture structure may have been formed by forming on the surface of the first-conductive-type contact layer 103 an electron beam resist pattern for use in forming a texture structure in, for example, electron beam drawing apparatus before the wafer was subjected to dry etching. FIG. 6 shows an exemplary texture structure in a schematic perspective view. The texture structure shown in FIG. 6 had truncated cone-shaped projections each of which had, for example, a bottom face with a diameter of 250 nm, a top face with a diameter of 225 nm, and a height of 250 nm and which may have been periodically arranged so that the centers of the truncated cones could form the apices of equilateral triangles each with three 350 nm sides as shown in the schematic plan view of FIG. 7. This texture structure, although not essential, could improve light extraction efficiency in extracting light from the first-conductive-type contact layer 103. Alternatively, in place of the texture structure, a moth-eye structure or another like low-reflectance structure may have been formed on the surface of the first-conductive-type contact layer 103 to improve the light extraction efficiency.

Next, as shown in FIG. 1, a first-conductive-side contact electrode (n-side contact electrode) 301 was formed. Specifically, a resist pattern for use in forming the first-conductive-side contact electrode 301 was formed by photolithography, after which the wafer was put into vapor deposition apparatus for deposition of a first-conductive-side; contact electrode layer having a Ti/Al multilayer structure. Thereafter, the wafer was taken out of the vapor deposition apparatus and subjected to a lift-off process to form the patterned first-conductive-side contact electrode 301. Following the lift-off process, the first-conductive-side contact electrode 301 was subjected to a heat treatment at 850° C. for 3 minutes for alloying and ohmic property imparting.

Next, a first-conductive-side pad electrode (n-side pad electrode) 302 was formed. Similarly to the formation of the first-conductive-side contact electrode 301, a resist pattern for use in forming the first-conductive-side pad electrode 302 was formed by photolithography, after which the wafer was put into vapor deposition apparatus for deposition of a first-conductive-side pad electrode layer composed of a Ti/Au multilayer film. Thereafter, the wafer was taken out of the vapor deposition apparatus and subjected to a lift-off process to form the patterned first-conductive-side pad electrode 302.

Next, for example, a dicing protection film and/or a current obstruction layer composed of an insulator such as $SiO_2$ was/were fanned on the wafer carrying thereon first-conductive-side electrodes (n-type electrodes) made up of the first-conductive-side contact electrode 301 and the first-conductive-side pad electrode 302.

Thereafter, the wafer carrying thereon, for example, the protection film and/or the current obstruction layer was diced into individual chips measuring 1 mm×1 mm, to form semiconductor chips. The wafer was diced using dicing apparatus in the present example. Alternatively, the wafer may have been diced using laser scribing apparatus or scribing apparatus.

The deep ultraviolet LED chip obtained by the wafer dicing was mounted, for example, either to an Al-coated stem via a submount composed of polycrystalline AlN with a high thermal conductivity or to an Al surface mount substrate, in such a manner that the conductive support substrate 205 on the second-conductive-side (p-side) could come into contact with the stem/substrate, and thereafter electrically connected to the first-conductive-side pad electrode (n-side pad electrode) 302 via Al wires. Finally, the chip was sealed with quartz glass to obtain a deep ultraviolet LED device.

In the present example, the support substrate, the wiring, and the sealing material for the deep ultraviolet LED device were an Al-coated stem or an Al surface mount substrate, Al wires, and quartz glass respectively. Instead, for example, a support substrate composed of a metal that sufficiently reflected deep ultraviolet light may have been used as the support substrate, and a resin that sufficiently transmitted deep ultraviolet light and that hardly degraded under deep ultraviolet light may have been used as the wiring and the sealing material.

Figure 14:
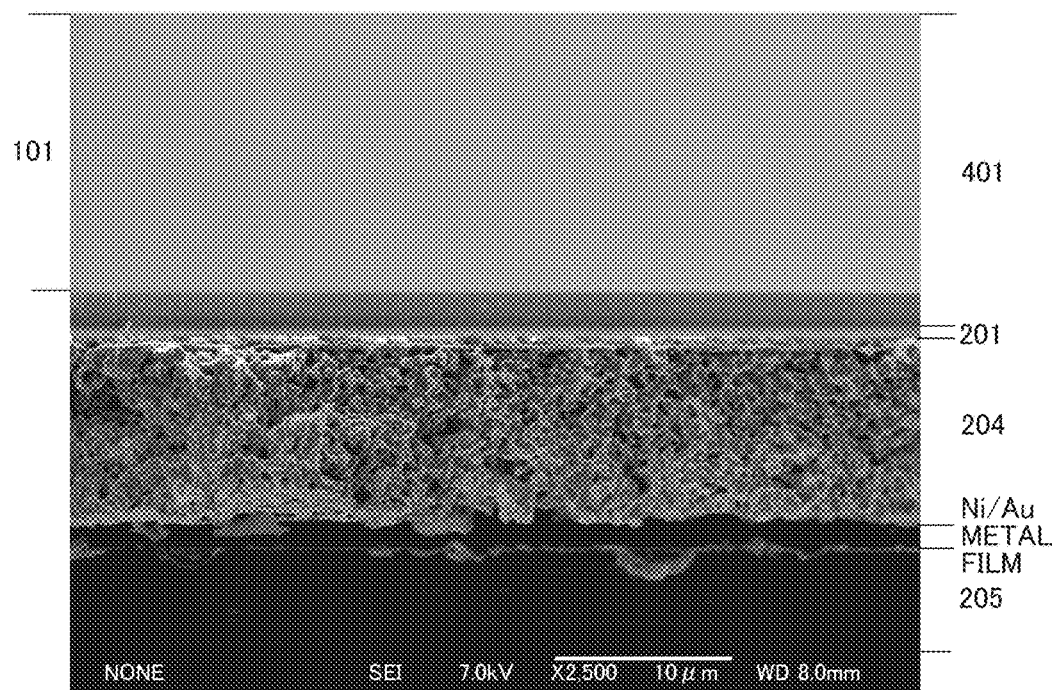
FIG. 14 is an SEM image showing an exemplary cross-section of a porous metal film in an aluminum nitride-based semiconductor deep ultraviolet light-emitting device in accordance with Example 1 of the present invention.
Figure 15:
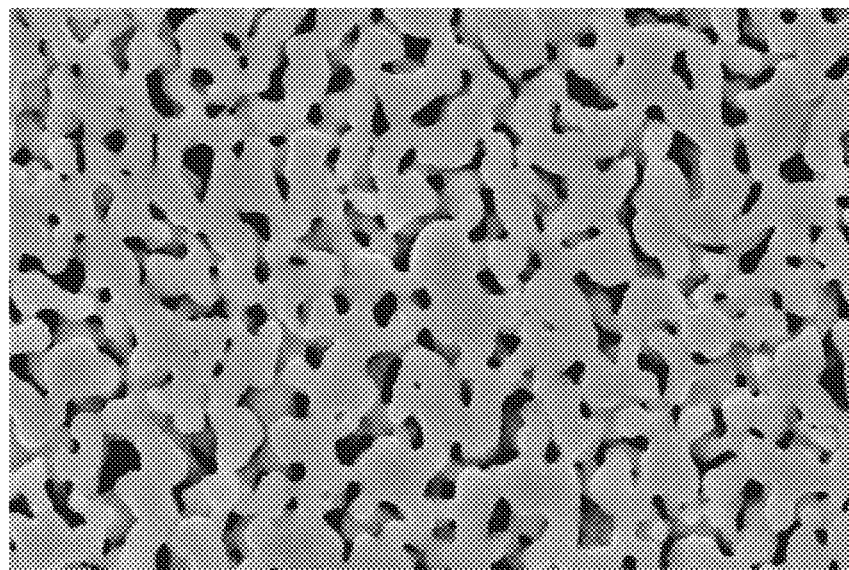
FIG. 15 is a scaled-up SEM image showing the exemplary cross-section of the porous metal film in the aluminum nitride-based semiconductor deep ultraviolet light-emitting device in accordance with Example 1 of the present invention.

FIGS. 14 and 15 show cross-sectional views of a porous metal film obtained in the aluminum nitride-based semiconductor deep ultraviolet light-emitting device of the present example obtained by setting the bonding conditions (pressure and temperature) to 5 atm and 225° C. From FIG. 15, the pore area ratio of the porous metal film was 63%, which value was raised to the power of 3/2 to calculate a pore rate (50%). The light emission efficiency was calculated from the light output that was obtained by integrating sphere measurement, which turned out to be as high as 12%. The yield was calculated as the proportion of those devices which satisfied required rated values for chip properties to the total number of devices manufactured, by inspecting all the devices manufactured, which turned out to be as high as 95%. Under a different set of bonding conditions where the pressure was 75 atm, and the temperature was 225° C., the pore rate of the porous metal film was 10%, the light emission efficiency was as high as 12%, and the yield was as high as 95%. These results show that the pore rate of the porous metal film was suitably from 10% to 50% inclusive. Any of these aluminum nitride-based semiconductor deep ultraviolet light-emitting devices had an emission peak wavelength of 250 nm when measured using a spectrophotometer. These results are shown in Table 1 along with other results.

In the aluminum nitride-based semiconductor deep ultraviolet light-emitting device of the present example, the support substrate and the aluminum nitride-based semiconductor layer structural body were bonded with a porous metal film having a macroporous structure with a pore rate of from 10% to 50% inclusive. The porous metal segment having a macroporous structure therefore absorbed the stress produced due to differences in thermal expansion coefficient between the support substrate, the porous metal film, the aluminum nitride-based semiconductor layer structural body, and the underlayer substrate, thereby restraining the aluminum nitride-based semiconductor layer structural body from detaching from the support substrate and cracks from forming in the aluminum nitride-based semiconductor layer structural body and in the porous metal film. That in turn increased the yield of the aluminum nitride-based semiconductor deep ultraviolet light-emitting device.

In addition, the porous metal film having a macroporous structure had high temperature resistance, which enabled the first-conductive-side contact electrode (n-side contact electrode) to be rendered ohmic by heat treatment at 500° C. or a higher temperature. That in turn enabled the formation of the first-conductive-side contact electrode that had good ohmic properties. The resultant vertically structured aluminum nitride-based semiconductor deep ultraviolet light-emitting device hence exhibited a high light emission efficiency and a high yield.

Additionally, it was observed that the acquired capability of forming an n-side contact electrode with good ohmic properties had reduced the operating voltage of the device and improved the light emission efficiency of the device.

Comparative Example 1

The present comparative example differs from Example 1 in that the wafer bonding conditions were changed: the pressure was changed to 1 atm, and the temperature was changed to 200° C. to 350° C. Under these wafer bonding conditions, the pore rate of the porous metal film exceeded 50%. The wafer was able to be bonded under these conditions as mentioned earlier in Example 1.

Figure 16:
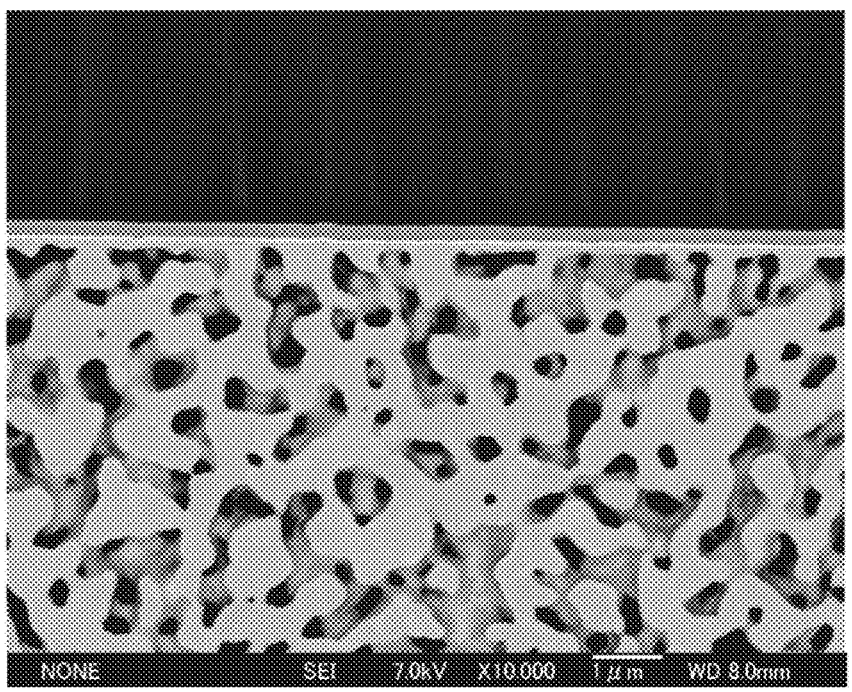
FIG. 16 is a scaled-up SEM image showing an exemplary cross-section of a porous metal film in an aluminum nitride-based semiconductor deep ultraviolet light-emitting device in accordance with Comparative Example 1 of the present invention.

FIG. 16 shows a cross-sectional view of a porous metal film obtained under the following wafer bonding conditions: the pressure was 1 atm, and the temperature was 250° C. From FIG. 16, the pore area ratio of the porous metal film was 71%, which value was raised to the power of 3/2 to calculate a pore rate (60%).

The wafer bonded using a porous metal film having a pore rate of 60% obtained under the bonding conditions above where the pressure was 1 atm and the temperature was 250° C. in accordance with the present comparative example was stripped of the underlayer substrate, provided with a first-conductive-side electrode (n-side electrode), separated into chips, and mounted by processes similar to those described in Example 1. In the aluminum nitride-based semiconductor deep ultraviolet light-emitting device of the present comparative example, the pore rate of the porous metal film was 60%, the emission peak wavelength was 250 nm, the light emission efficiency was as low as 5%, and the yield was extremely low at 60%. These results, shown in Table 1 along with other results, were probably caused by a significant loss of conductivity that occurred because crosslinking sections in the porous metal film having a macroporous stricture were destructed due to their failure to resist changes in stress in the 900° C. heat treatment in which the first-conductive-side electrode (n-side electrode) was rendered ohmic.

Comparative Example 2

The present comparative example differs from Example 1 in that the wafer bonding conditions were changed: the pressure was changed to 80 atm to 100 atm inclusive, and the temperature was changed to 200° C. to 350° C. Under these wafer bonding conditions, the pore rate of the porous metal film was lower than 10%. The wafer was able to be bonded also under these conditions as mentioned in Example 1.

Figure 17:
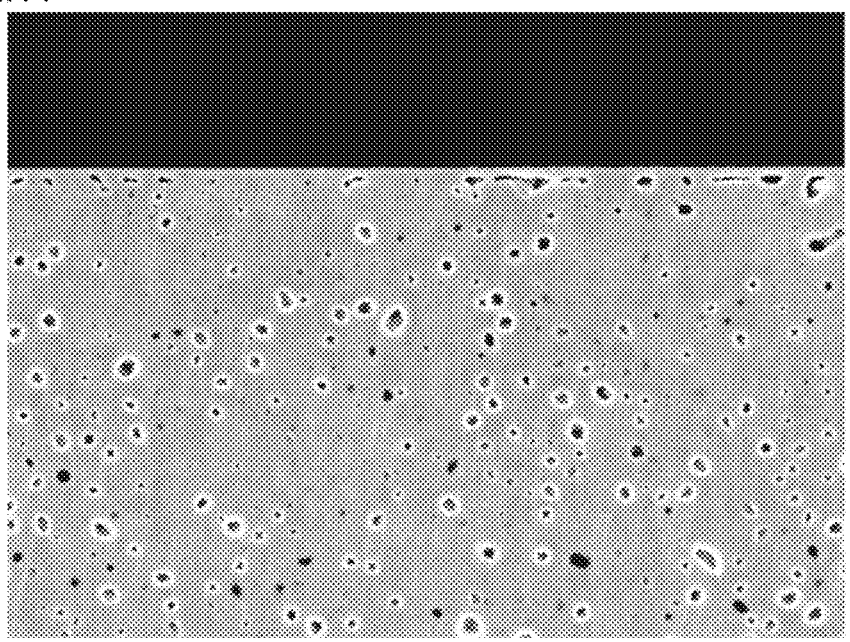
FIG. 17 is a scaled-up SEM image showing an exemplary cross-section of a porous metal film in an aluminum nitride-based semiconductor deep ultraviolet light-emitting device in accordance with Comparative Example 2 of the present invention.

FIG. 17 shows a cross-sectional view of a porous metal film obtained under the following wafer bonding conditions: the pressure was 100 atm, and the temperature was 350° C. From FIG. 17, the pore area ratio of the porous metal film was 14%, which value was raised to the power of 3/2 to calculate a pore rate (5%).

The wafer bonded using a porous metal film having a pore rate of 5% obtained under the bonding conditions above where the pressure was 100 atm and the temperature was 350° C. in accordance with the present comparative example was attempted to be stripped of the underlayer substrate, provided with a first-conductive-side electrode (n-side electrode), separated into chips, and mounted by processes similar to those described in Example 1. However, the aluminum nitride-based semiconductor layer structural body frequently detached from the silicon substrate as the support substrate in removing the underlayer substrate and/or after the 900° C. heat treatment in which a second-conductive-side electrode (p-side electrode) was rendered ohmic. In the aluminum nitride-based semiconductor deep ultraviolet light-emitting device of the present comparative example, the pore rate of the porous metal film was 5%, the emission peak wavelength was 250 nm, the light emission efficiency was as low as 4%, and the yield was extremely low at 70%. These results, shown in Table 1 along with other results, were probably caused under sonic influence of changes in stress produced due to differences in thermal expansion coefficient between, for example, the support substrate, the porous metal film, the aluminum nitride-based semiconductor layer structural body, and the underlayer substrate. After the underlayer substrate was removed, the stress would be released, allowing the silver film to shrink and the aluminum nitride-based semiconductor layer structural body to detach.

On the other hand, as in Example 1, if the porous metal film had a macroporous structure with a pore rate of from 10% to 50% inclusive, the stress was probably absorbed by the pores, restraining the aluminum nitride-based semiconductor layer structural body from detaching. Similar causes could be possible for the aluminum nitride-based semiconductor layer structural body detaching from the support substrate after the 900° C. heat treatment in which the second-conductive-side electrode (p-side electrode) was rendered ohmic: the stress accumulated in the porous metal film during the heat treatment at a higher temperature of 900° C. would induce the detachment of the semiconductor wafer from the silicon substrate.

Example 2

Referring FIG. 8, the present example differs from Example 1 in that not all the sapphire substrate as an underlayer substrate is removed (i.e., the sapphire substrate is only partly removed). AlN and GaN have a refractive index in excess of 2 for deep ultraviolet light in the wavelength range of from 300 to 220 nm. These refractive indices are larger than the refractive index of sapphire (approximately 1.6). Therefore, an advantageous light extraction efficiency can be achieved in some instances if light is picked up through the underlayer substrate rather than if light is picked up from an n-type $Al_{0.65}Ga_{0.35}N$ layer (first-conductive-type contact layer) with all the underlayer substrate (sapphire substrate) being removed. The light extraction efficiency can vary not only depending on the structure of the light-emitting device chip in assembly steps, but also under the influence of other factors such as the shape and refractive index of the mold resin. The device hence needs to be designed for optimal performance.

Referring to FIG. 3, a sapphire substrate as an underlayer substrate 101 is put into MOCVD apparatus, to obtain an aluminum nitride-based semiconductor wafer 401 similarly to Example 1. Furthermore, the wafer is subjected to a heat treatment to activate second-conductive-type layers (p-type layers) and provided with a second-conductive-side electrode (p-side electrode), after which the aluminum nitride-based semiconductor wafer 401 carrying thereon the second-conductive-side contact electrode 201 (p-type contact electrode) is bonded to the conductive support substrate 205 with the porous metal film 204 interposed therebetween, all similarly to Example 1. The bonding conditions are the same as the standard bonding conditions of Example 1 (pressure: 50 atm; temperature: 300° C.) under which a porous metal film was obtained with a pore rate of 25% in Example 1. Bonding conditions may be chosen from a pressure range of from 5 atm to 75 atm inclusive and a temperature range of 200° C. to 350° C. inclusive. These alternative sets of conditions yield porous metal films with a pore rate of from 10% to 50% inclusive.

After the wafer is bonded, a laser beam (wavelength 193 nm) is projected from above the underlayer substrate 101 into the aluminum nitride-based semiconductor wafer 401 similarly to Example 1 to detach the sapphire substrate. Note that in the present example, the laser beam is projected only into the parts of the aluminum nitride-based semiconductor wafer 401 where the underlayer substrate is to be removed. FIG. 9 shows a schematic cross-sectional view after the laser radiation. There remains a residual layer 402 that originates from the buffer layer 102 decomposed under the laser radiation, adhering to where a laser beam has been projected as shown in FIG. 9 similarly to Example 1. Accordingly, the detachment face is cleaned. Subsequently, a first-conductive-side contact electrode (n-side contact electrode) 301 and a first-conductive-side pad electrode (n-side pad electrode) 302 are formed on this cleaned detachment face of the underlayer substrate by patterning similarly to Example 1.

After these first-conductive-side electrodes (n-type electrodes) are formed, a texture structure may be formed by dry etching after an electron beam resist pattern or a resin pattern for use in forming a texture structure is formed on the surface of the sapphire substrate as the underlayer substrate 101 in, for example, electron beam drawing apparatus or nano-imprint apparatus or by using a resin mold. FIG. 6 shows an exemplary texture structure in a schematic perspective view similarly to Embodiment 1. This texture structure, although not essential, is able to improve light extraction efficiency in extracting light from the underlayer substrate. Alternatively, in place of the texture structure, a moth-eye structure or another like low-reflectance structure may be formed on the surface of a growth substrate to improve the light extraction efficiency.

After the light extraction structure is formed, the wafer is provided with a dicing protection film, a current obstruction layer, and the like composed of an insulator such as $SiO_2$ if necessary, similarly to Embodiment 1. After that, the wafer is diced into individual chips of a suitable size 1 mm×1 mm in the present embodiment). The chip is mounted to a stem or as an SMD (surface mounted device), the first-conductive-side pad electrode (n-side pad electrode) and other elements are wired, and the resultant chip is sealed with, for example, an ultraviolet-transmitting resin to obtain an ultraviolet LED device.

In the present example, no decreases in the process yield are caused by, for example, the aluminum nitride-based semiconductor layer structural body detaching from the support substrate or cracks forming in the aluminum nitride-based semiconductor layer structural body or in the porous metal film. In addition, the acquired capability of forming an n-side contact electrode with good ohmic properties reduces the operating voltage of the device and improves the light emission efficiency of the device. In the aluminum nitride-based semiconductor deep ultraviolet light-emitting device of the present example, the pore rate of the porous metal film is 15%, the emission peak wavelength is 250 nm, the light emission efficiency is as high as 11%, and the yield is as high as 96%. These results are shown in Table 1 along with other results.

Example 3

Referring to FIG. 10, the present example differs from Example 1 in that a semiconductor laser and/or a superluminescent diode, both being an edge-emitting LED, is/are formed.

Referring to FIG. 3, a sapphire substrate as an underlayer substrate 101 is put into MOCVD apparatus where a buffer layer 102 composed of a 300-nm thick AlN layer, a first-conductive-type contact layer 103 composed of a 3-µm thick, n-type $Al_{0.65}Ga_{0.35}N$ layer, a first-conductive-type layer, a light-emitting layer 104 having a multiple quantum well structure of 6 cycles of 3-nm thick $Al_{0.80}Ga_{0.20}N$ barrier layers and 2-nm thick $Al_{0.36}Ga_{0.74}N$ well layers, a second-conductive-type block layer 105 composed of a 15-nm thick, p-type $Al_{0/85}Ga_{0.15}N$ block layer, a second-conductive-type layer 106, and a second-conductive-type contact layer 107 composed of a 50-nm thick, p-type $Al_{0.25}Ga_{0.75}N$ contact layer are stacked in this sequence on a main face of the sapphire substrate to obtain an aluminum nitride-based semiconductor layer structural body 403, and hence an aluminum nitride-based semiconductor wafer 401.

Referring to FIG. 10, the present example needs a structure that confines the light emitted by the light-emitting layer 104 in a layered structure by means of differences in refractive index to fabricate an edge-emitting LED. Therefore, a first-conductive-type layer 108 (n-type layer) and a second-conductive-type layer 106 (p-type layer) need to be respectively a first-conductive-type (n-type) cladding layer and a second-conductive-type (p-type) cladding layer that have a higher Al composition than the well layers in the light-emitting layer that have a suitable refractive index difference from the light-emitting layer 104. Alternatively, a multilayer structure may be used that includes a light guide layer as an optical waveguide layer. Accordingly, in the present example, the first-conductive-type layer 108 has a double-layer stricture that is composed of a 75-nm thick, n-type $Al_{0.67}Ga_{0.32}N$ guide layer and a 750-nm thick, n-type $Al_{0.78}Ga_{0.22}N$ cladding layer, the former being disposed closer to the light-emitting layer 104, and the second-conductive-type layer 106 has a double-layer structure that is composed of a p-type $Al_{0.86}Ga_{0.32}N$ guide layer and a p-type $Al_{0.78}Ga_{0.22}N$ cladding layer, the former being disposed closer to the light-emitting layer 104. In addition, the well layers in the light-emitting layer are made of $Al_{0.26}Ga_{0.74}N$.

After forming the at aluminum nitride-based semiconductor layer structural body 403, a heat treatment is performed to activate second-conductive-type layers (p-type layers) to Example 1.

Subsequently, a second-conductive-side electrode (p-side electrode) is formed. In the present example, to fabricate an edge-emitting LED based on stimulated emission, a p-side electrode is formed that has a stripe electrode structure in which current paths are restricted because an inverted distribution of carriers, which is a condition for stimulated emission, is readily obtainable in such a structure. Specifically, as shown in FIG. 10, a 2.5-nm thick Ni layer as a first layer and a 5.0-nm thick, patterned second-conductive-side contact electrode 201 (p-side contact electrode), as a second layer, composed of a 2.5-nm thick Au layer are formed by photolithography only in tight-emitting regions through which electric current flows. An insulating layer 206 is formed on the other regions to form a current obstruction layer that obstructs electric current injection to semiconductor regions. The insulating layer 206 is a 250-nm thick $SiO_2$ layer in the present example.

After forming the stripe electrode structure, similarly to Example 1, the aluminum nitride-based semiconductor wafer is bonded to a conductive support substrate 205, the support substrate is removed, and the first-conductive-side electrodes (n-side electrodes) are formed. Since the light-emitting device of the present example is an edge-emitting type, there is no need to form a tight extraction structure.
Mounting After forming the first-conductive-side electrodes (an n-side contact electrode as a first-conductive-side contact electrode 301 and an n-side pad electrode as a first-conductive-side pad electrode 302), the wafer is provided with a dicing protection film, a current obstruction layer, and the like composed of an insulator such as $SiO_2$ if necessary. After that, the wafer is cleaved to form an exit face and separated into many bars. In the present example, the wafer is separated into 800-μm wide bars.

Subsequently, to obtain a semiconductor laser one of cleaved faces is subjected to a high reflection coating process to form a light-reflecting face, and the other cleaved face is subjected to, for example, a low reflection coating process and a protective coating process in accordance with an intended use, to form a laser exit face. To obtain a superluminescent LED, a low reflection coating, a non-flat, irregular surface, an inclined surface, or another edge reflection-lowering structure is formed on the edge to prevent lasing.

After this edge processing, the bar is separated into individual chips of a suitable size (0.8 mm×0.4 mm in the present example). The edge-emitting LED chip obtained by the wafer dicing is mounted to a stem, the first-conductive-side pad electrode (n-side pad electrode) and other elements are wired, and the resultant chip is sealed with, for example, an ultraviolet-transmitting resin to obtain an edge-emitting ultraviolet LED.

In the present example, no decreases in the yield are caused by, for example, a detaching aluminum nitride-based semiconductor layer structural body or cracks in the aluminum nitride-based semiconductor layer structural body and in the porous metal film. In addition, the acquired capability of forming a first-conductive-side contact layer (n-side contact electrode) with good ohmic properties reduces the operating voltage the device and improves the light emission efficiency of the device. In the aluminum nitride-based semiconductor deep ultraviolet light-emitting device of the present example, the pore rate of the porous metal film is 17%, the emission peak wavelength is 265 nm, the light emission efficiency is as high as 14%, and the yield is as high as 96%. These results are shown in Table 1 along with other results.

Example 4

Referring to FIG. 11, the present example is similar to Example 3 in that, for example, a semiconductor laser and a superluminescent diode, both being an edge-emitting LED, are formed. The present example relates to an edge-emitting LED in which a ridge stripe structure is formed that more readily induces stimulated emission than the stripe electrode structure of Example 3.

Similarly to Example 3, a sapphire substrate as an underlayer substrate 101 is put into MOCVD apparatus to form an aluminum nitride-based semiconductor layer structural body 403, and hence an aluminum nitride-based semiconductor wafer 401. Next a heat treatment is performed to activate second-conductive-type layers (p-type layers) similarly to Example 3.

Subsequently, some parts of a second-conductive-type contact layer 107 (p-type contact layer) and adjacent parts of a second-conductive-type layer 106 (p-type layer) are removed (in other words, in some regions, the second-conductive-type contact layer 107 is totally removed, and the second-conductive-type layer 106 is partly removed) by photolithography and dry etching as shown in FIG. 11, to form a ridge stripe structure.

Subsequently, a second-conductive-side electrode (p-type electrode) is formed. As shown in FIG. 11, a second-conductive-side contact electrode 201 (p-side contact electrode) is formed where no dry etching is performed. Where dry etching is performed, an insulating layer 206 is formed for current obstruction. In the present example, the ridge width is 4 μm, and the dry etching is done to the depth of 700 nm. The insulating layer 206 as a current device layer is a 500-nm thick $SiO_2$ layer.

After forming the ridge stripe structure, similarly to Example 3, the aluminum nitride-based semiconductor wafer 401 is bonded to a conductive support substrate 205, the underlayer substrate 101 is removed from the aluminum nitride-based semicondutor wafer 401, and then first-conductive-side electrodes (a first-conductive-side contact electrode 301 and a first-conductive-side pad electrode 302) are formed. Since the device of the present example is an edge-emitting type, there is no need to form a light extraction structure.

Subsequently, similarly to Example 3, the wafer is provided with, for example, a dicing protection film and/or a current obstruction layer composed of an insulator such as $SiO_2$ if necessary. After that, the wafer is cleaved to form an exit face and separated into many bars. In the present example, the wafer is separated into 800-μm wide bars.

Subsequently, to obtain a semiconductor laser one of cleaved faces is subjected to a high reflection coating process to form a light-reflecting face, and the other cleaved face is subjected to, for example, a low reflection coating process and a protective coating process in accordance with an intended use, to form a laser exit face. To obtain a superluminescent LED, a low reflection coating, a non-flat, irregular surface, an inclined surface, or another edge reflection-lowering structure is formed on the edge to prevent lasing.

After the edge processing, the bar is separated into individual chips of a suitable size (0.8 mm×0.4 mm in the present example). The edge-emitting LED chip obtained by the wafer dicing is mounted to a stem, the first-conductive-side pad electrode 302 (n-side pad electrode) and other elements are wired, and the resultant chip is sealed with, for example, an ultraviolet-transmitting resin to obtain an edge-emitting ultraviolet LED.

In the present example, no decreases in the yield are caused by, for example, a detaching aluminum nitride-based semiconductor layer structural body or cracks in the aluminum nitride-based semiconductor layer structural body and in the porous metal film. In addition, the acquired capability of forming a first-conductive-side contact layer (n-side contact electrode) with good ohmic properties reduces the operating voltage of the device and improves the light emission efficiency of the device. In the aluminum nitride-based semiconductor deep ultraviolet light-emitting device of the present example, the pore rate of the porous metal film is 15%, the emission peak wavelength is 260 nm, the light emission efficiency is as high as 10%, and the yield is as high as 96%. These results are shown in Table 1 along with other results.

Example 5

Referring to FIG. 12, the present example is similar to Example 3 in that, for example, a semiconductor laser and a superluminescent diode, both being an edge-emitting LED with a stripe electrode structure, are formed and differs from Example 3 in that the underlayer substrate in the present example is only partly removed.

Similarly to Example 3, a sapphire substrate as an underlayer substrate 101 is put into MOCVD apparatus to form an aluminum nitride-based semiconductor layer structural body 403, and hence an aluminum nitride-based semiconductor wafer 401. Next, a heat treatment is performed to activate second-conductive-type layers (p-type layers) similarly to Example 3. After that, a stripe electrode structure is formed.

After forming the stripe electrode structure, similarly to Example 3, the aluminum nitride-based semiconductor wafer 401 is bonded to a conductive support substrate 205, the underlayer substrate 101 (sapphire substrate) is removed from the aluminum nitride-based semiconductor wafer 401, and then first-conductive-side electrodes (a first-conductive-side contact electrode 301 and a first-conductive-side pad electrode 302) are formed. In the present example, not all the sapphire substrate is removed (the sapphire substrate is only partly removed). In other words, the laser beam is projected only onto those parts of the sapphire substrate which are to be removed. The parts of the sapphire substrate to be removed are, as shown in FIG. 12, preferably immediately above the electrode stripes. Since the device of the present example is an edge-emitting type, there is no need to form a light extraction structure.

Subsequently, similarly to Example 3, the wafer is provided with, for example, a dicing protection film and/or a current obstruction layer composed of an insulator such as $SiO_2$ if necessary. After that, the wafer is cleaved to form an exit face and separated into many bars. In the present example, the wafer is separated into 800-μm wide bars.

Subsequently, to obtain a semiconductor laser LED, one of cleaved faces is subjected to a high reflection coating process to form a light-reflecting face, and the other cleaved face is subjected to, for example, a low reflection coating process and a protective coating process in accordance with an intended use, to form a laser exit face. To obtain a superluminescent LED, a low reflection coating, a non-flat, irregular surface, an inclined surface, or another edge reflection-lowering structure is formed on the edge to prevent lasing.

After the edge processing, the bar is separated into individual chips of a suitable size (0.8 mm×0.4 mm in the present example). The edge-emitting LED chip obtained by the wafer dicing is mounted to a stein, the first-conductive-side pad electrode 302 (n-side pad electrode) and other elements are wired, and the resultant chip is sealed with, for example, an ultraviolet-transmitting resin to obtain an edge-emitting ultraviolet LED.

In the present example, no decreases in the yield are caused by, for example, a detaching aluminum nitride-based semiconductor layer structural body or cracks in the aluminum nitride-based semiconductor layer structural body and in the porous metal film. In addition, the acquired capability of forming an n-side contact electrode with good ohmic properties reduces the operating voltage of the device and improves the light emission efficiency of the device. In the aluminum nitride-based semiconductor deep ultraviolet light-emitting device of the present example, the pore rate of the porous metal film is 16%, the emission peak wavelength is 260 nm, the light emission efficiency is as high as 13%, and the yield is as high as 96%, These results are shown in Table 1 along with other results.

Example 6

Referring to FIG. 13, the present example is similar to Example 4 in that, for example, a semiconductor laser and a superluminescent diode, both being an edge-emitting LED with a ridge stripe structure, are formed and differs from Example 4 in that the underlayer substrate in the present example is only partly removed.

Similarly to Example 4, a sapphire substrate as an underlayer substrate 101 is put into MOCVD apparatus to form an aluminum nitride-based semiconductor layer structural body 403, and hence an aluminum nitride-based semiconductor wafer 401. Next, a heat treatment is performed to activate second-conductive-type layers (p-type layers) similarly to Example 4. After that, a ridge stripe structure is formed.

After forming the ridge stripe structure, similarly to Example 4, the aluminum nitride-based semiconductor wafer 401 is bonded to a conductive support substrate 205, the underlayer substrate 101 (sapphire substrate) is removed from the aluminum nitride-based semiconductor wafer 401, and then first-conductive-side electrodes (a first-conductive-side contact electrode 301 and a first-conductive-side pad electrode 302) are formed. In the present example, not all the sapphire substrate is removed (i.e., the sapphire substrate is only partly removed). In other words, the laser beam is projected only onto those parts of the sapphire substrate which are to be removed. The parts of the sapphire substrate to be removed are, as shown in FIG. 13, preferably immediately above the electrode stripes. Since the device of the present example is an edge-emitting type, there is no need to form a light extraction structure.

Subsequently, similarly to Example 4, the wafer is provided with., for example, a dicing protection film and/or a current obstruction layer composed of an insulator such as $SiO_2$ if necessary. After that, the wafer is cleaved to form an exit face and separated into many bars. In the present example, the wafer is separated into 800-μm wide bars.

Subsequently, to obtain a semiconductor laser one of cleaved faces is subjected to a high reflection coating process to form a light-reflecting face, and the other cleaved face is subjected to, for example, a low reflection coating process and a protective coating process in accordance with an intended use, to form a laser exit face. To obtain a superluminescent LED, a low reflection coating, a non-flat, irregular surface, an inclined surface, or another edge reflection-lowering structure is formed on the edge to prevent lasing.

After the edge processing, the bar is separated into individual chips of a suitable size (0.8 mm×0.4 mm in the present example). The edge-emitting LED chip obtained by the wafer dicing is mounted to a stem, the first-conductive-side pad electrode 302 (n-side pad electrode) and other elements are wired, and the resultant chip is sealed with, for example, an ultraviolet-transmitting resin to obtain an edge-emitting deep ultraviolet LED.

In the present example, no decreases in the yield are caused by, for example, a detaching aluminum nitride-based semiconductor layer structural body or cracks in the aluminum nitride-based semiconductor layer structural body and in the porous metal film. In addition, the acquired capability of forming an n-side contact electrode with good ohmic properties reduces the operating voltage of the device and improves the light emission efficiency of the device. In the aluminum nitride-based semiconductor deep ultraviolet light-emitting device of the present example, the pore rate of the porous metal film is 15%, the emission peak wavelength is 265 nm, the light emission efficiency is as high as 14%, and the yield is as high as 96%. These results are shown in Table 1 along with other results.

nitride-based semiconductor deep ultraviolet light-emitting device has an emission peak wavelength of from 220 nm to 300 nm inclusive. By setting the pore rate of the porous metal film to 10% to 50% inclusive in this device, a vertically structured, aluminum nitride-based semiconductor deep ultraviolet light-emitting device that exhibits a high light emission efficiency and a high yield is obtained.

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

REFERENCE SIGNS LIST

101 Underlayer Substrate
102 Buffer Layer
103 First-conductive-type Contact Layer
104 Light-emitting Layer
105 Second-conductive-type Block Layer
106 Second-conductive-type Layer
107 Second-conductive-type Contact Layer
108 First-conductive-type Layer
201 Second-conductive-side Contact Electrode
202 Reflective Electrode
204 Porous Metal Film
205 Conductive Support Substrate
206 Insulating Layer
301 First-conductive-side Contact Electrode
302 First-conductive-side Pad Electrode
304 First-conductive-side Translucent Conductive Film
401 Aluminum Nitride-based Semiconductor Wafer
402 Residual Layer
403 Aluminum Nitride-based Semiconductor Layer Structural Body

What is claimed is:
1. An aluminum nitride-based semiconductor deep ultraviolet light-emitting device having a vertical structure, comprising:

TABLE 1

|  | Ex. 1 | Ex. 2 | Ex. 3 | Ex. 4 | Ex. 5 | Ex. 6 | Comp. 1 | Comp. 2 |
|---|---|---|---|---|---|---|---|---|
| LED Structure | FIG. 1 | FIG. 8 | FIG. 10 | FIG. 11 | FIG. 12 | FIG. 13 | FIG. 1 | FIG. 1 |
| Pore Rate of Porous Metal Film (%) | 50 | 10 | 15 | 17 | 15 | 16 | 15 | 60 | 5 |
| Emission Peak Wavelength (nm) | 250 | 250 | 250 | 265 | 260 | 260 | 265 | 250 | 250 |
| Light Emission Efficiency (%) | 12 | 12 | 11 | 14 | 10 | 13 | 14 | 5 | 4 |
| Yield (%) | 95 | 95 | 96 | 96 | 96 | 96 | 96 | 60 | 70 |

Ex.: Example;
Comp.: Comparative Example

Referring to Table 1, an aluminum nitride-based semiconductor deep ultraviolet light-emitting device includes: a conductive support substrate; a porous metal film having a conductive macroporous structure; and an aluminum nitride-based semiconductor layer structural body with a light-emitting layer, the conductive support substrate and the aluminum nitride-based semiconductor layer structural body being bonded with the porous metal film interposed therebetween for electrical connection, wherein the aluminum a conductive support substrate;
a porous metal film having a conductive macroporous structure with a pore rate of 10% to 50% inclusive;
an aluminum nitride-based semiconductor layer structural body with a light-emitting layer; and
a second-conductive-side contact electrode,
the aluminum nitride-based semiconductor layer structural body including a first-conductive-type contact layer, a first-conductive-type layer, the light-emitting layer, a second-conductive-type layer, and a second-conductive-type contact layer in this sequence, the conductive support substrate and the second-conductive-type contact layer of the aluminum nitride-based semiconductor layer structural body being bonded to each other with the porous metal film and the second-conductive-side contact electrode interposed therebetween for electrical connection, wherein:

the aluminum nitride-based semiconductor deep ultraviolet light-emitting device has a structure that restricts a second-conductive-side current path;

the structure is one of a stripe electrode structure and a ridge stripe structure;

in the stripe electrode structure, the second-conductive-side contact electrode is formed only on a part of the second-conductive-type contact layer and an insulating layer is formed on a part where no second-conductive-side contact electrode is formed;

in the ridge stripe structure, an insulating layer is formed to replace a part of the second-conductive-type contact layer; and the aluminum nitride-based semiconductor deep ultraviolet light-emitting device has an emission peak wavelength of 220 nm to 300 nm inclusive.

2. The aluminum nitride-based semiconductor deep ultraviolet light-emitting device according to claim 1, wherein the first-conductive-type layer and the second-conductive-type layer each have a multilayer structure of layers of different Al composition.

3. The aluminum nitride-based semiconductor deep ultraviolet light-emitting device according to claim 1, wherein:
the first-conductive-type contact layer is a first-conductive-type $Al_xGa_{1-x}N$ contact layer where $0<x\leq1$; and
the second-conductive-type contact layer is a second-conductive-type $Al_yGa_{1-y}N$ contact layer where $0.25\leq y\leq1$.

4. The aluminum nitride-based semiconductor deep ultraviolet light-emitting device according to claim 1, wherein the porous metal film is a metal film containing silver.

5. The aluminum nitride-based semiconductor deep ultraviolet light-emitting device according to claim 1, wherein the conductive support substrate is a silicon substrate.

* * * * *